(12) United States Patent
Mane et al.

(10) Patent No.: US 11,393,681 B2
(45) Date of Patent: Jul. 19, 2022

(54) METHODS TO DEPOSIT AND ETCH CONTROLLED THIN LAYERS OF TRANSITION METAL DICHALCOGENIDES

(71) Applicant: UCHICAGO ARGONNE, LLC, Chicago, IL (US)

(72) Inventors: Anil U. Mane, Naperville, IL (US); Jeffrey W. Elam, Elmhurst, IL (US)

(73) Assignee: UChicago Argonne, LLC, Chicago, IL (US)

( * ) Notice: Subject to any disclaimer, the term of this patent is extended or adjusted under 35 U.S.C. 154(b) by 185 days.

(21) Appl. No.: 16/294,797

(22) Filed: Mar. 6, 2019

(65) Prior Publication Data
US 2019/0279870 A1    Sep. 12, 2019

Related U.S. Application Data

(60) Provisional application No. 62/639,888, filed on Mar. 7, 2018.

(51) Int. Cl.
*H01L 21/20*    (2006.01)
*H01L 21/02*    (2006.01)

(52) U.S. Cl.
CPC .... *H01L 21/02568* (2013.01); *H01L 21/0228* (2013.01); *H01L 21/0262* (2013.01); *H01L 21/02205* (2013.01); *H01L 21/02255* (2013.01)

(58) Field of Classification Search
CPC ........... H01L 21/02205; H01L 21/0228; H01L 21/02381; H01L 21/02433; H01L 21/02568; H01L 21/02255; H01L 21/02614; H01L 21/02623

USPC ......................................................... 438/487
See application file for complete search history.

(56) References Cited

U.S. PATENT DOCUMENTS

| | | | |
|---|---|---|---|
| 5,998,229 A | 12/1999 | Lyu et al. | |
| 8,741,688 B2 | 6/2014 | Quick et al. | |
| 2013/0280546 A1 | 10/2013 | Elam et al. | |
| 2015/0179839 A1 | 6/2015 | Van Duren et al. | |
| 2015/0211112 A1 | 7/2015 | Cadot et al. | |
| 2015/0333200 A1 | 11/2015 | Chirila et al. | |
| 2016/0005963 A1 | 1/2016 | Kim | |
| 2016/0122868 A1 | 5/2016 | Kim et al. | |
| 2016/0168694 A1 | 6/2016 | Min | |
| 2017/0011915 A1* | 1/2017 | Cannara | H01L 21/02614 |
| 2017/0133547 A1 | 5/2017 | Reinhard et al. | |
| 2017/0243993 A1 | 8/2017 | Reinhard et al. | |
| 2017/0250075 A1 | 8/2017 | Caymax et al. | |

(Continued)

FOREIGN PATENT DOCUMENTS

WO    WO-2015/091781 A2    6/2015

OTHER PUBLICATIONS

Agrawal, et al. "Fast detection and low power hydrogen sensor using edge-oriented vertically aligned 3-D network of MoS2 flakes at room temperature," Applied Physics Letters 111, 093102, 6 pages (2017).

(Continued)

*Primary Examiner* — Brook Kebede
(74) *Attorney, Agent, or Firm* — Foley & Lardner LLP

(57) ABSTRACT

Transition metal dichalcogenides (TMDs) are deposited by atomic layer deposition as thin layers on a substrate. The TMDs may be grown on oxide substrates and may have a tunable TMD-oxide interface. The TMD may be etched using an atomic layer etching technique.

8 Claims, 20 Drawing Sheets

(56) References Cited

U.S. PATENT DOCUMENTS

| | | |
|---|---|---|
| 2017/0267527 A1 | 9/2017 | Kim et al. |
| 2018/0105930 A1 | 4/2018 | Kang et al. |
| 2018/0127873 A1 | 5/2018 | Sarnet et al. |
| 2018/0269291 A1* | 9/2018 | Lin .................... H01L 29/1054 |
| 2019/0279870 A1 | 9/2019 | Mane et al. |
| 2020/0340119 A1 | 10/2020 | Mane et al. |
| 2021/0087677 A1 | 3/2021 | Wong et al. |

OTHER PUBLICATIONS

Browning, et al., "Atomic layer deposition of MoS2 thin films," Materials Research Express 2(3), 5 pages (2015).

Chhowalla, et al., "The chemistry of two-dimensional layered transition metal dichalcogenide nanosheets," Nature Chemistry 5, pp. 263-275 (2013).

Delabie, et al., "Low temperature deposition of 2D WS2 layers from WF6 and H2S precursors: impact of reducing agents," Chemical Communications 51, pp. 15692-5695 (2015).

Domask, et al., "Transition Metal-MoS2 Reactions: Review and Thermodynamic Predictions," Journal of Electronic Materials 44(11), pp. 4065-4079 (2014).

Dong, et al., "Review Article: Progress in fabrication of transition metal dichalcogenides heterostructure systems featured," J. Vac. Sci. Technol. B, 35(3), 15 pages (May/Jun. 2017).

Eda, et al., "Photoluminescence from Chemically Exfoliated MoS2," Nano Lett., 11(12), pp. 5111-5116 (2011).

Elam, et al., "Viscous flow reactor with quartz crystal microbalance for thin film growth by atomic layer deposition," Review of Scientific Instruments 73, 2981 (2002).

Feng, et al., "Synthesis of Large-Area Highly Crystalline Monolayer Molybdenum Disulfide with Tunable Grain Size in a H2 Atmosphere," ACS Appl. Mater. Interfaces 7(40), pp. 22587-22593 (2015).

George, "Atomic layer deposition: an overview," Chemical Reviews 110(1), pp. 111-131 (2010).

Grubbs, et al., "Nucleation and growth durig the atomic layer deposition or W on Al2O3 and Al2O3 on W," Thin Solid Films 467(1-2), pp. 16-27 (2004).

Hegner, et al., "Ultralarge atomically flat template-stripped Au surfaces for scanning probe microscopy," Surface Science 291(1-2), pp. 39-46 (1993).

Helveg, et al., "Atomic-Scale Structure of Single-Layer MoS2 Nanoclusters," Physical Review Letters 84, p. 951 (Jan. 31, 2000).

Imanishi, et al., "Synthesis of MoS2 Thin Film by Chemical Vapor Deposition Method and Discharge Characteristics as a Cathode of the Lithium Secondary Battery," Journal of the Electrochemical Society 139(8), pp. 2082-2087 (1992).

Jang, et al., "Wafer-scale, conformal and direct growth of MoS2 thin films by atomic layer deposition," Applied Surface Science 365, pp. 160-165 (2016).

Jin, et al., "Novel chemical route for atomic layer deposition of MoS2 thin film on SiO2/Si substrate," Nanoscale 6(23), pp. 14453-14458 (2014).

Joensen, et al., "Single-layer MoS2," Materials Research Bulletin 21(4), pp. 457-461 (1986).

Jurca, et al., "Low-Temperature Atomic Layer Deposition of MoS2 Films," Angewandte Chemie International Edition 56(18), pp. 4991-4995 (2017).

Kam, et al., "Detailed photocurrent spectroscopy of the semiconducting group VIB transition metal dichalcogenides," The Journal of Physical Chemistry 86(4), pp. 463-467 (1982).

Kumar, et al., "Reaction mechanism of core-shell MoO2/MoS2 nanoflakes via plasma-assisted sulfurization of MoO3," Materials Research Express 3(5) (2016).

Lee, et al., "Crystal orientation and near-interface structure of chemically vapor deposited MoS2 films," Journal of Materials Research 10(1), pp. 49-53 (1995).

Lee, et al., "Preparation of MoS2 thin films by chemical vapor deposition," Journal of Materials Research 9(6), pp. 1474-1483 (1994).

Li, et al. "Inkjet Printing of MoS2," Advanced Functional Materials 24(41), pp. 6524-6531 (2014).

Li, et al., "From Bulk to Monolayer MoS2: Evolution of Raman Scattering," Advanced Functional Materials 22(7), pp. 1385-1390 (2012).

Lifshitz, et al., "Selective Molybdenum Deposition by LPCVD," Journal of The Electrochemical Society 134(8), pp. 2061-2067 (1987).

Mane, "Atomic layer deposition of molybdenum disulfide films using MoF6 and H2S," Journal of Vacuum Science & Technology A 36, 01A125, 9 pages (2018).

Mattinen, et al., "Atomic Layer Deposition of Crystalline MoS2 Thin Films: New Molybdenum Precursor for Low-Temperature Film Growth," Advanced Materials Interfaces 4(18), 11 pages (2017).

Mattnen, et al., "Atomic Layer Deposition or Crystalline MoS2 Thin Films: New Molybdenum Precursor for Low-Temperature Film Growth," Advanced Materials Interfaces 4(18), 1700123, 11 pages (2017).

Muratore, et al., "Continuous ultra-thin MoS2 films grown by low-temperature physical vapor deposition," Applied Physics Letters 104, 261604 (2014).

Nandi, et al., "Atomic Layer Deposited MoS2 as a Carbon and Binder Free Anode in Li-ion Battery," Electrochimica Acta 146, pp. 706-713 (2014).

Novoselov, et al. "Electric Field Effect in Atomically Thin Carbon Films," Science 306(5696), pp. 666-669 (2004).

O'Neill, et al., "Preparation of High Concentration Dispersions of Exfoliated MoS2 with Increased Flake Size," Chemistry of Materials 24(12), pp. 2414-2421 (2012).

Pyeon, et al., "Wafer-scale growth of MoS2 thin films by atomic layer deposition," Nanoscale 8, pp. 10792-10798 (2016).

Qin, et al., "In situ growth of double-layer MoO3/MoS2 film from MoS2 for hole-transport layers in organic solar cell," Journal of Materials Chemistry A 2, pp. 2742-2756 (2014).

Radisavljevic, et al., "Single-layer MoS2 transistors," Nature Nanotechnology 6, pp. 147-150 (2011).

Ross & Sussman, "Surface Oxidation of Molybdenum Disulfide," The Journal of Physical Chemistry 59(9), pp. 889-892 (1955).

Rowley-Neale, et al., "2D nanosheet molybdenum disulphide (MoS2) modified electrodes explored towards the hydrogen evolution reaction," Nanoscale 7, pp. 18152-18168 (2015).

Scharf, et al., "Atomic layer deposition of tungsten disulphide solid lubricant thin films," Journal of Materials Research 19(12), pp. 3443-3446 (2004).

Scharf, et al., "Growth, structure, and tribological behavior of atomic layer-deposited tungsten disulphide solid lubricant coatings with applications to MEMS," Acta Materialia 54(18), pp. 4731-4743 (2006).

Seghete, et al., "Molybdenum Atomic Layer Deposition Using MoF6 and Si2H6 as the Reactants," Chemistry of Materials 23(7), pp. 1668-1678 (2011).

Spalvins, "A review of recent advances in solid film lubrication," Journal of Vacuum Science & Technology A: Vacuum, Surfaces, and Films 5(2), pp. 212-219 (1987).

Splendiani, et al., "Emerging Photoluminescence in Monolayer MoS2," Nano Letters 10 (4), pp. 1271-1275 (2010).

Tan, et al., "Atomic layer deposition of a MoS2 film," Nanoscale 6, pp. 10584-10588 (2014).

Tenne, "Advances in the Synthesis of Inorganic Nanotubes and Fullerene-Like Nanoparticles," Angewandte Chemie International Edition 42, pp. 5124-5132 (2003).

Valdivia, "Atomic layer deposition or two dimensional MoS2 on 150 mm substrates," Journal or Vacuum Science & Technology A: Vacuum, Surfaces, and Films 34, 021515 (2016).

Vila, et al., "Bottom-up synthesis of vertically oriented two-dimensional materials," 2D Materials 3(4) (2016).

Voiry, et al., "Conducting MoS2 Nanosheets as Catalysts for Hydrogen Evolution Reaction," Nano Letters 13(12), pp. 6222-6227 (2013).

(56) References Cited

OTHER PUBLICATIONS

West & Menzies, "The Vapor Pressures of Sulphur between 100 and 550 with related Thermal Data," The Journal of Physical Chemistry 33(12), pp. 1880-1892 (1929).

Wu, et al., "Establishment of 2D Crystal Heterostructures by Sulfurization of Sequential Transition Metal Depositions: Preparation, Characterization, and Selective Growth," Nano Letters 16(11), pp. 7093-7097 (2016).

Wypych, et al., "1T-MoS2, a new metallic modification of molybdenum disulfide," Journal of the Chemical Society: Chemical Communications 0, pp. 1386-1388 (1992).

Yu, et al., "Controlled Scalable Synthesis of Uniform, High-Quality Monolayer and Few-layer MoS2 Films," Scientific Reports 3, 6 pages (2013).

Browning, R., "Atomic Layer Deposition of MoS2 thin films." Materials Research Express, 2 (2015), 0035006, pp. 1-5.

Cao, et al., "Area-Selective Growth of HfS2 Thin Films via Atomic Layer Deposition at Low Temperature." Adv. Mater. Interfaces 2020, 2001493, pp. 1-9.

Chae, S. et al., "Oxidation Effect in Octahedral Hafnium Disulfide Thin Film." ACS Nano 2016, 10, pp. 1309-1316.

Huang, Y., et al., "Recent progress in atomic layer deposition of molybdenum disulfide: a mini review." Science China Materials, 2019, 62(7): pp. 913-924.

Jang, Y., et al., "Wafer-scale, conformal and direct growth of MoS2 thin films by atomic layer deposition." Applied Surface Science, 365 (2016), pp. 160-165.

Mane, A., et al., "Atomic layer deposition of molybdenum disulfide films using MoF6 and H2S." J. Vac. Sci. Technol. A 36(1), Jan./Feb. 2018, 01A125-1 to 01A125-9.

Mattinen, et al., "Atomic Layer Deposition of Emerging 2D Semiconductors, HfS2 and ZrS2, for Optoelectronics," Chem. Mater. 2019, 31, pp. 5713-5724.

Seghete, D., et al., "Molybdenum Atomic Layer Deposition Using MoF6 and Si2H6 as the Reactants." Chem. Mater. 2011, 23, pp. 1668-1678.

Zhan, et al., "Large-Area Vapor-Phase Growth and Characterization of MoS2 Atomic Layers on a SiO2 Substrate," Small 8(7), pp. 966-971 (2012).

Zhan, et al., "Supporting Information for Large-Area Vapor-Phase Growth and Characterization of MoS2 Atomic Layers on a SiO2 Substrate," Small, 12 pages (2012).

Dasgupta, et al., "Atomic Layer Deposition of Metal Sulfide Materials," Accounts of Chemical Research 48(2), pp. 341-348 (2015).

Guauque & Blue, "Hydrogen Sulfide. The Heat Capacity and Vapor Pressure of Solid and Liquid. The Heat of Vaporization. A Comparison of Thermodynamic and Spectroscopic Values of the Entropy," Journal of the American Chemical Society 58(5), pp. 831-837 (1936).

Kwon, et al., "A comprehensive study on atomic layer deposition of molybdenum sulfide for electrochemical hydrogen evolution," Nanoscale 8(13), pp. 7180-1788 (2016).

Kwon, et al., "High-performance and scalable metal-chalcogenide semiconductors and devices via chalco-gel routes," Science Advances 4(4), 10 pages (2018).

Wirtz, et al., "Atomic layer deposition on 2D transition metal chalcogenides: layer dependent reactivity and seeding with organic ad-layers," Chemical Communications 51(92), pp. 16553-16556 (2015) (5 pages accepted manuscript provided).

* cited by examiner

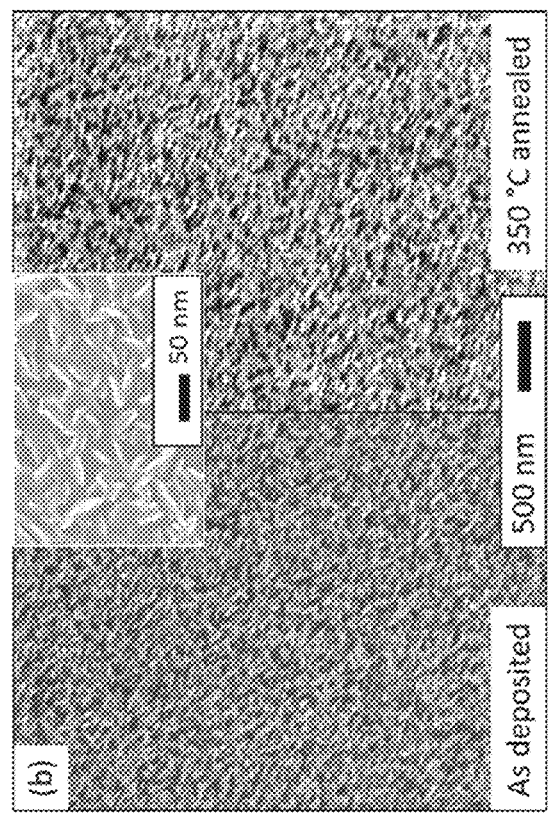
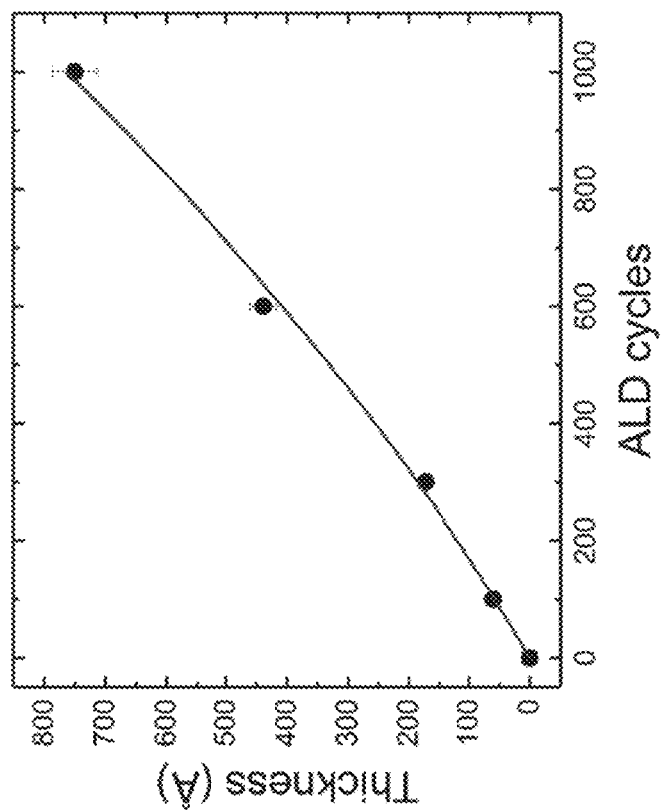
Figure 3A
Figure 3B

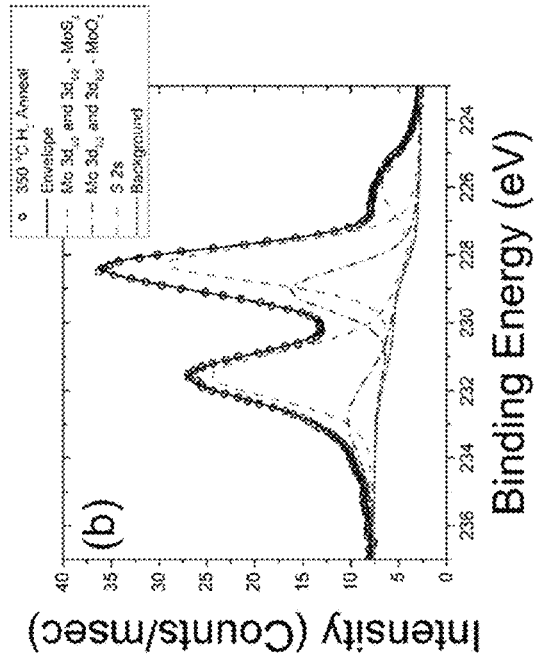
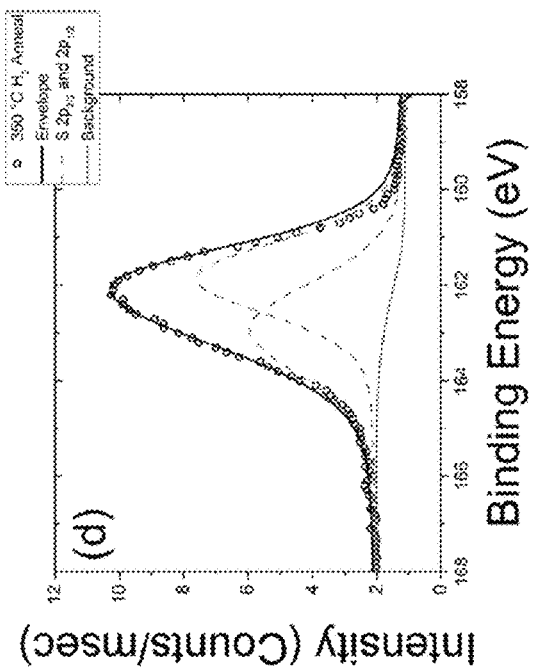
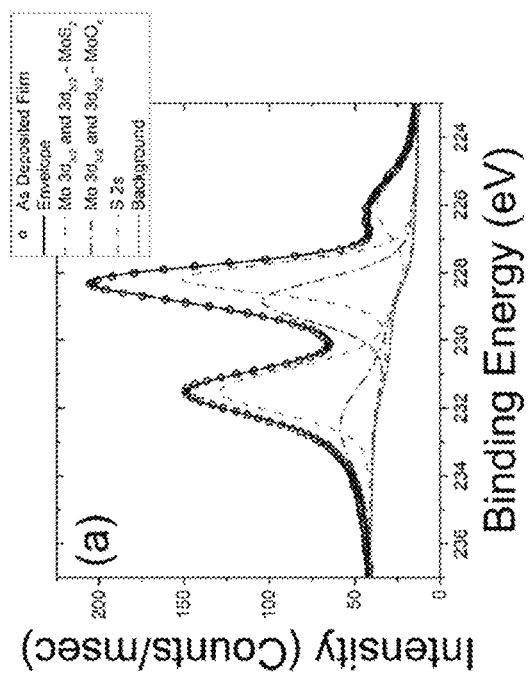
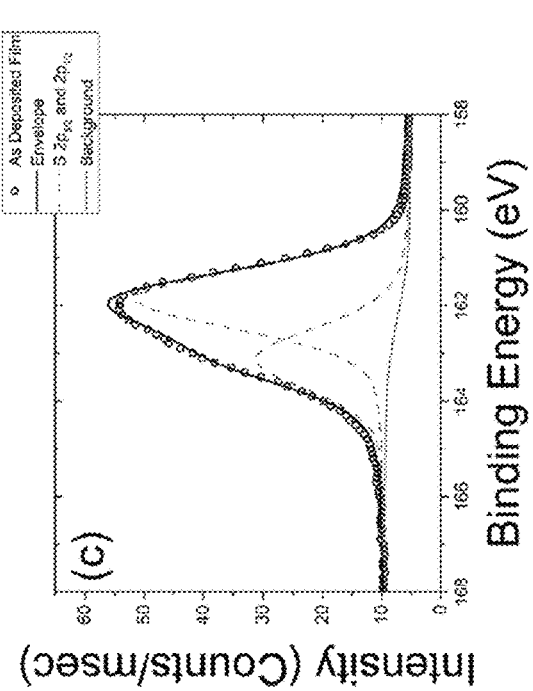
Figure 6A
Figure 6B
Figure 6C
Figure 6D

METHODS TO DEPOSIT AND ETCH CONTROLLED THIN LAYERS OF TRANSITION METAL DICHALCOGENIDES

CROSS-REFERENCE TO RELATED APPLICATIONS

This application claims priority to and the benefit of U.S. Provisional Application No. 62/639,888, filed on Mar. 7, 2018, the content of which is incorporated by reference in its entirety.

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates generally to transition metal dichalcogenides (TMDs), specifically methods for depositing and etching thin layers of TMDs.

BACKGROUND

TMDs have been studied for over 50 years. Some properties of TMDs are well known. For example, some TMDs are metals, some are semiconductors and even superconductors, while some are insulators. Further, TMDs exhibit desirable properties such as a high mobility, tunable bandgap and electrochemical properties. TMDs have been found to be useful in a wide range of applications such as electronic devices, electrochemical storage devices, tribological materials, sensors, and the like.

TMDs materials such as molybdenum disulfide ($MoS_2$) and tungsten disulfide ($WS_2$) were used primarily as solid-state lubricants. These materials have layered structures and were heavily researched in their bulk (multilayer), nanotube, and fullerene structural forms. More recently, the unique optical, chemical, mechanical and electrical properties of these materials have attracted much attention, with $MoS_2$ quickly becoming the prototypical TMD. The bulk $MoS_2$ is a diamagnetic that has a band gap of 1.3 eV, whereas single monolayer $MoS_2$ has a unique indirect-to-direct band gap transition of 1.8 eV. This presents a unique opportunity for semiconductor device manufacturing compared to the more widely studied graphene which is metallic (no bandgap) in its native state.

Despite the widespread utility of TMDs, their use and adoption as a material faces several challenges. Layered structure materials, such as two-dimensional (2D) TMDs, have grown rapidly in the past decade. One of the biggest challenge in realizing their full potential has been the lack of practical synthesis methods of such films with high uniformity over large area substrates, conformality, and interfacing with oxides. After the mechanical exfoliation of graphene was reported in 2004, a more practical method was available for other 2D materials to be synthesized and researched. Due to the structure of TMDs, bulk crystals have typically been harvested by micromechanical cleavage or chemical processes inspired by processed used with other materials, such as graphite/graphene, to provide atomically thin flakes. For example, existing work on layered TMOs has relied rely on: (i) flakes produced by exfoliation from bulk, (ii) synthesis by high temperature (800-1000° C.) chemical vapor deposition, or (iii) solution-based methods. Each of these methods fails to provide a TMD material with sufficient quality and precision of control (most notably for thickness). Further, these existing mechanisms for forming thin layer TMDs do not provide the ability to integrate them into complex heterostructures.

2D $MoS_2$ has been synthesized using a variety of top-down and bottom-up methods. Typical top-down methods are mechanical exfoliation, liquid exfoliation, and ion intercalation. These methods can yield high quality monolayer films up to 2.25 µm from bulk crystals. Liquid exfoliation has been used to create dispersions of monolayer $MoS_2$ for inkjet printing flexible electronics. While some bottom-up approaches have been used they typically have been only limited to high temperature (400-900° C.) CVD. High temperatures results in several issues, including poor growth rate, uncontrolled growth and failure to provide uniform coating.

Although rough mechanical exfoliation techniques exist, there remains a need for highly tunable/controllable growth of TMD material scalable for growth over a wide area and integrated with other materials as a heterostructure.

SUMMARY

Embodiments described herein relate generally to a method of preparing a substrate comprising: performing an a atomic layer deposition cycle exposure for a transition metal precursor at a first deposition temperature between 50° C. and 400° C.; performing a b atomic layer deposition cycle exposure for a sulfur precursor at a second deposition temperature between 50° C. and 400° C.; performing a plurality of z supercycles of the a atomic layer deposition cycle and of the b atomic layer deposition cycle; forming a transition metal dichalcogenide coating; and thermally annealing the transition metal dichalcogenide coating in a $H_2$ or $H_2S$ environment.

Another embodiments relates to a method of forming a transition metal and transition metal dichalcogenide stack comprising: exposing a first transition metal precursor at a first deposition temperature between 50° C. and 400° C.; exposing a sulfur precursor at a second deposition temperature between 50° C. and 400° C.; depositing a layer of transition metal dichalcogenide; exposing a second transition metal precursor at a third deposition temperature between 50° C. and 400° C.; exposing a reducing precursor at a fourth deposition temperature between 50° C. and 400° C.; and depositing a transition metal on the transition metal dichalcogenide.

Another embodiment relates to a method of etching a transition metal dichalcogenide comprising: etching. The etching is by performing an atomic layer deposition cycle exposure for an etching transition metal halide precursor at a first deposition temperature between 50° C. and 400° C.; performing an atomic layer deposition cycle exposure of water at a second deposition temperature between 50° C. and 400° C.; and removing portions of a transition metal dichalcogenide coating.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIGS. 3A-3B show results for an embodiment of deposited TMD. FIG. 3A shows a graph of film thickness as a function of $MoS_2$ ALD cycles as measured by ellipsometry. FIG. 3B is a scanning electron microscopy (SEM) image of an as-deposited film after 600 cycles with a thickness of 45 nm (left) and annealed film (right). The inset of FIG. 3B shows a higher resolution SEM image of the as-deposited film. ALD reaction was carried out at 200° C.

FIGS. 6A-6D show high resolution XPS scans for Mo 3d as deposited (FIG. 6A), Mo 3d after anneal (FIG. 6B), S 2p as-deposited (FIG. 6C), and S 2p after anneal (FIG. 6D).

FIG. 10B shows QCM data magnified for a few ALD cycles from FIG. 10A. QCM data for $MgS_2$ 10 s purge times and a constant 2 s dose times for $MgCp_2$ and 0.5 s for $H_2S$ precursors.

FIG. 12A schematically depicts different etching behavior for a hypothetical thin film versus dosing time of the etching precursor where graph (a) is atomic layer etching (ALE), (d) is continuous etching, and (b) and (c) are intermediate cases where the behavior is mostly ALE, but some continuous etching is observed also. FIG. 12B shows a schematic for a hypothetical ALE process using etching chemicals A and B, where A prepares the surface for etching and B performs the actual etching.

FIG. 15A shows QCM at 200° C. for $MoS_2$ ALD using $MoF_6$ and $H_2S$ from 0-450 s, followed by $MoS_2$ ALE using $MoF_6$ and $H_2O$. Each $MoF_6$ and $H_2O$ exposure is divided into numerous microdoses of the same precursor in succession to illustrate that the ALE is self-limiting for both the $MoF_6$ and $H_2O$ steps. FIG. 15B demonstrates saturation of the $MoS_2$ ALD process as a function of both the $MoF_6$ and $H_2O$ dose times. For both precursors, the purge time is kept constant at 20 s. Prior to etching experiment, ALD $MoS_2$ is performed with $MoF_6$ and $H_2S$ were pulsed using ALD cycle of ($MoF_6$—$N_2$—$H_2S$—$N_2$)=(1-10-1-10 s) timing sequence until steady state growth was achieved at 200° C.

Figure 1B:
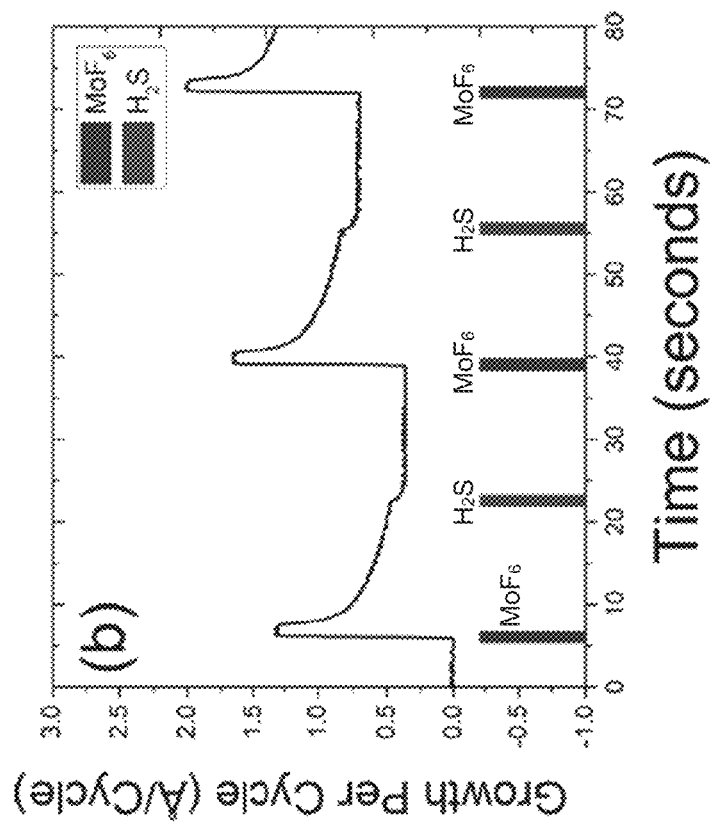
FIGS. 1A-1B show in situ quartz crystal microbalance (QCM) measurements during molybdenum sulfide atomic layer deposition (ALD) at 200° C. using the timing sequence (1.5-15-1.5-15 s) over 19 ALD cycles (FIG. 1A) and expanded view of two successive ALD cycles (FIG. 1B). The molybdenum hexafluoride ($MoF_6$) and hydrogen sulfide ($H_2S$) dosing periods are indicated at the bottom of the graphs.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to formation of TMDs by ALD. ALD offers the best combination of a layer-by-layer growth of the material with highest conformality and integration with other oxides such as high-K dielectrics (e.g., $Al_2O_3$, $HfO_2$, etc.) to realize 3D heterojunctions. The ability to control the synthesis of films over large areas will be important for future large-scale manufacturing for integrating into complex device structures.

ALD is a vapor-phase, thin film deposition method based on alternating self-limiting surface reactions. ALD typically uses gaseous precursors to react with the exposed surface (of a substrate, then of preceding layers). The precursors are selected such that the first precursor binds to the substrate and then is modified by reaction with the second precursor to leave the desired element or compound. The precursor may be applied as a continuous exposure for a period of time or may be applied as micropulses of very short duration extending over a period of time. A purge gas may be used to clear the reaction chamber of a precursor, both to ensure termination of the reaction and prevent undesired reactions with the other precursor is injected. The nature of ALD lends itself to be a unique deposition method capable of precise control over thin film thickness and stoichiometry, as well as the ability to deposit conformal coatings over high surface area morphologies.

TMD can be represented as $MX_2$ where M is a transition metal and X is a chalcogenide. TMDs have a layered structure where each layer consists of an X-M-X unit. TMD crystals are typically described as having trigonal or octahedral prismatic coordination to help describe the material in a single layer, where each M atom has six X atoms forming a hexagon above and below it. These atomic trilayers feature strong in-plane covalent bonding but weak van der Waals bonding between layers. This dichotomy of bonding characteristics facilitates the synthesis and isolation of single layer TMDs. $MoS_2$ in the bulk crystalline form has three stable phases under standard conditions: 2H, 3R and 1T.

One embodiment relates to a method of forming TMDs on a substrate via ALD by performing a atomic layer deposition exposures of a transition metal precursor at a first deposition temperature between 100° C. and 300° C. and b) atomic layer deposition exposures of a sulfur precursor at a second deposition temperature between 50° C. and 300° C., and forming a transition metal dichalcogenide coating on the substrate. It should be appreciated that the ALD TMD growth, as well as optimal temperature, will vary based on the precursor sublimation temperature and the stability. Deposition temperature is based on thermodynamics of the precursors reaction at elevated temperature. In one embodiment, the temperature for deposition is between 100° C. and 400° C. In one embodiment, the growth temperature range for the ALD process is 50° C.-300° C.

The a and b exposures constitute one ALD cycle. The TMD film can be made thicker by performing additional ALD cycles. The resultant deposited material may be further processed by annealing. In one embodiment the annealing temperature range for the ALD process is 400° C.-800° C.

Figure 21:
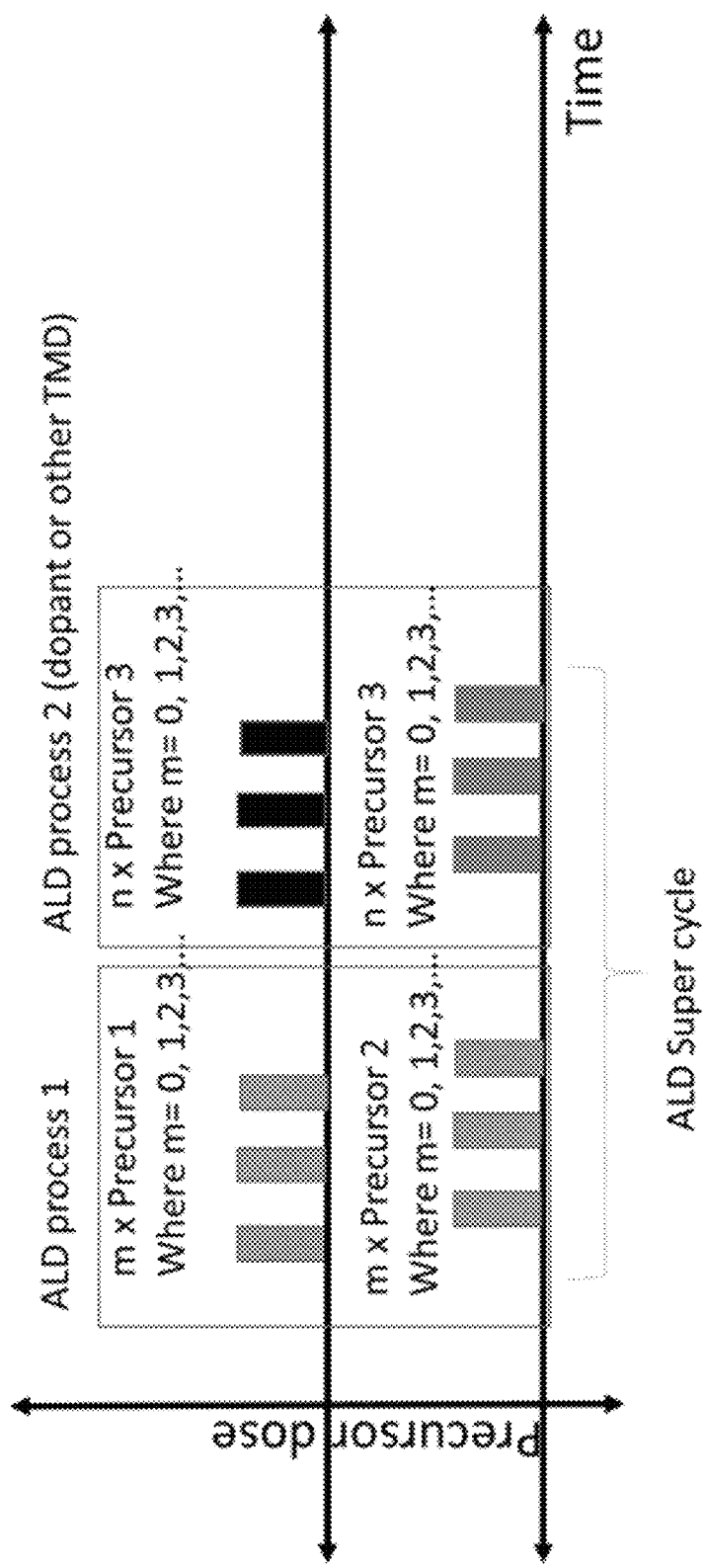
FIG. 21 shows impact of precursor dosage and cycle time.

ALD cycle duration will be based on precursor vapor pressure and its subsequent saturation behavior and the depositing object surface area. For example, in one embodiment using a 300 mm Si wafer substrate, one ALD cycle duration can be ($MoF_6$—$N_2$—$H_2S$—$N_2$)=(1-10-1-10 s). However, using porous glass (8"×8") as a substrate with surface area ~10 m$^2$, one ALD cycle duration can be ($MoF_6$—$N_2$—$H_2S$—$N_2$)=(10-30-10-30 s). FIG. 21 illustrates that deposition cycles for the first precursor and second precursor can be used in many combinations given below but number of doses and time will be based on precursor saturation on the surface.

The general recipe for ALD will be based on many factors known to those skilled in the art, such as the nature of ALD cycles, precursor functional group, vapor pressure, substrate temperature, reactor geometry, ALD reaction chamber pressure, and, most importantly, the combination of precursors. CVD-type precursors may not be compatible due to the difference in the processes. For example, $MoS_2$ using $MoF_6$—$H_2S$ by ALD is feasible but $MoS_2$ using (Mo(CO$_5$)—$H_2S$ is not feasible by ALD (but could be for CVD).

For example, ALD $MoS_2$ can grow at 100° C. using $MoF_6$—$H_2S$. In a second example, ALD $HfS_2$ can grow at 150° C. with TDMA-Hf and $H_2S$. $HfS_2$ can also be prepared at >200° C. with $HfCl_4$ and $H_2S$. In the $HfCl_4$ precursor case, the sublimation temperature for $HfCl_4$ is 150° C.; therefore, the deposition temperature must be higher to avoid condensation of the $HfCl_4$.

Mixed TMDs can be prepared by alternating between the ALD chemistries of the component materials. For instance, mixed $MoS_2$—$HfS_2$ can be prepared by performing c $MoS_2$ ALD cycles followed by d $HfS_2$ cycles. The composition of the film is dictated by the c/d ratio, while the thickness is determined by the total cycle number c+d.

Doped TMDs can be prepared by interposing one or more cycles of a second TMD material during the process of growing a first TMD material. For instance, Mg-doped $HfS_2$ can be prepared by interrupting the ALD chemistry for $HfS_2$ (TDMA-Hf/$H_2S$) and performing one or more cycles of Mg(Cp)$_2$/$H_2S$, and then returning to the $HfS_2$ chemistry. The doping level of Mg is controlled by the ratio of $MgS_2$ cycles to the total number of TMD cycles, and the thickness is determined by the total number of ALD TMD cycles.

Doping of the TMD can tune the bandgap and other properties. For example, $MoS_2$ can be doped with W using tungsten hexafluoride (WF$_6$) to form a compound described as $W_xMo_yS_2$. In one embodiment, the doping is accomplished by selection of a compatible precursor (e.g., $MoF_6$ and $H_2S$ for $MoS_2$ growth and $WF_6$ for dopant, and vice versa), which can give good materiel and only F can be impurity. The dopant precursor may be selected such that the waste material after ALD reaction includes the same elements or materials as for the primary ALD reaction ($MoS_2$ formation, in one example). In other cases, one can deposit $MoS_2$ using $MoF_6$ and $H_2S$ and then dope W with other precursor (e.g., $W(CO)_5$); in that case, W-doped $MoS_2$ material can deposit but now we may have F and C as impurity.

In particular, described herein are two examples of TMDs deposited by ALD: $MoS_2$ ALD using $MoF_6$ and $H_2S$ and $HfS_2$ using $Hf(TMAH)_4$ and $H_2S$. Notably, while CVD processes have used a wired range of precursors, such cannot be expected to simply be usable directly in ALD. As those in the art will appreciate, CVD relies upon a reaction of two precursors in their gaseous or vapor form with the resultant material deposited on the surface of the underlying substrate. In contrast, ALD proceeds via the saturated surface reactions of first one precursor and then the other.

$MoF_6$ is reduced readily by both Si and $H_2$:

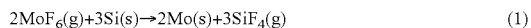

$$2MoF_6(g) + 3Si(s) \rightarrow 2Mo(s) + 3SiF_4(g) \qquad (1)$$

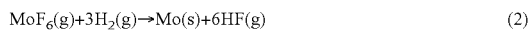

$$MoF_6(g) + 3H_2(g) \rightarrow Mo(s) + 6HF(g) \qquad (2)$$

The free energy changes for these reactions are −450 and −237 kJ/mol Mo, respectively, at 200° C., indicating that both reactions are thermodynamically highly favorable. In a previous report of Mo layers by ALD using $MoF_6$ and disilane, the authors reported self-limiting behavior but measured a higher than predicted growth per cycle which they attributed to CVD (i.e., $MoF_6 \rightarrow Mo + 3F_2$) promoted by local, transient heating from the very exothermic ALD surface reactions.

In, examples described below, x-ray amorphous molybdenum sulfide films were grown by ALD using $MoF_6$ and $H_2S$. In situ QCM measurements revealed that both half-reactions are self-limiting at 200° C. Crystalline films were achieved after annealing at 350° C. in a hydrogen environment. The growth rate could be enhanced using diethyl zinc without changing the optical band gap of the material.

Examples

ALD of $MoS_2$

In one experimental embodiment, a $MoS_2$ coating was fabricated using the parameters listed in Table 1 below.

TABLE 1

| Parameters | Values |
| --- | --- |
| Precursor | $MoF_6$ and $H_2S$ |
| Number of ALD cycles | up to 1000 |
| ALD cycles duration ($MoF_6$—$N_2$—$H_2S$—$N_2$) | Optimized (1-5-1-5 s) |
| Deposition temperature | 200° C. |
| Purge gas ($N_2$) flow | 300 sccm |
| Thermal annealing (1Torr $H_2$) | 350° C. |

$MoS_2$ ALD was performed using a custom viscous flow, hot-walled reactor, which was detailed previously. Deposition was performed on ~1"×1" coupons of Si with the native oxide intact and fused silica. The reactor temperature was maintained at 200° C. for all samples. During growth, ultra-high purity $N_2$ (99.999%) was adjusted so the system process pressure was approximately 1 Torr. Molybdenum hexafluoride ($MoF_6$ 98%, Sigma Aldrich) and hydrogen disulfide ($H_2S$ 99.5%, Matheson Trigas) were sequentially pulsed into the reactor with purges of $N_2$ between each exposure. The $MoF_6$ and $H_2S$ partial pressures were 20 mTorr and 150 mTorr during dosing of the respective precursor. The delivery pressure in the reactor for both precursors was regulated with both an inline 200 μm aperture (Lenox Laser) and a metering valve. Both gases are extremely dangerous and special precautions are needed due to the flammability/toxicity of $H_2S$ and the corrosive nature of $MoF_6$. The ALD timing can be described as $t_1$-$t_2$-$t_3$-$t_4$, where $t_1$ and $t_3$ are the $MoF_6$ and $H_2S$ exposure times, respectively, and $t_2$ and $t_4$ are the corresponding purge times, with all times in seconds (s). For the $MoS_2$ growth, $t_1$ and $t_3$ were both 1 s, while the purge times ($t_2$ and $t_4$) were kept at 5 s. In some experiments, the samples were annealed in situ after deposition on a temperature-controlled hot stage. The sample annealing was performed in ultrahigh purity hydrogen at 350° C. holding for 15 min. The samples were then cooled quickly back to room temperature. In addition to the binary chemistry of $MoF_6$ and $H_2S$, the $MoS_2$ ALD was promoted/doped with ZnS using two successive ZnS ALD cycles composed of DEZ (99% Sigma Aldrich) and $H_2S$.

Experiments deposited $MoS_2$ on variety of substrates, such as Silicon, $SiO_2$, polyamide, quartz, anodic aluminum oxide (AAO), trench wafer, ITO, W, Mo, TiN, etc. This ALD grown $MoS_2$ layers was characterized by various method and confirms the desire material growth.

The $MoS_2$ ALD was investigated by in situ QCM measurements using a modified Maxtek Model BSH-150 sensor head. An RC-cut quartz crystal (Phillip Technologies) with an alloy coating was used as the sensor due to its broad temperature range. To prevent deposition on the back side of the crystal, silver paste was used to seal the crystal and sensor head. A backside $N_2$ purge was adjusted to approximately 0.5% of the process pressure.

XPS measurements were carried out at the KECKII/NUANCE facility at Northwestern University on a Thermo Scientific ESCALAB 250 Xi (Al Kα radiation, hv=S5 1486.6 eV) equipped with an electron flood gun. Lower resolution survey scans and high resolution scans of the 3d, 2s, and 2p electron energies were performed. The XPS data were analyzed using THERMO AVANTAGE 5.97 software, and all spectra were referenced to the C1s peak (284.8 eV). Peak deconvolution in the high-resolution spectra (Mo 3d, S 2p) was performed using the Powell fitting algorithm with 30% mixed Gaussian-Lorentzian fitted peaks in all cases. Fitting procedures were based on constraining the spinorbit split doublet peak areas and FWHM according to the relevant core level (e.g., $3d_{5/2}$ and $3d_{3/2}$ is constrained to 3:2 peak area).

Raman spectroscopy (inVia, Renishaw) was used to probe the layered structure. The $E_{2g}$ and $A_{1g}$ vibrational modes arise from the in-plane and out-of-plane modes, respectively. Measurements were performed in reflection using an excitation wavelength of 514 nm on all samples. To prevent sample damage, a neutral density filter of 5%-10% transmission was used. A D2 Phaser x-ray diffractometer (XRD) (Bruker) using a Cu Kα source in Bragg-Brentano geometry was used to probe the crystallinity and crystal structure of the $MoS_2$. A J. A. Woollam, Inc. α-SE Ellipsometer (Lincoln, Nebr.) was used to measure the thickness of the bulk films using a Cauchy model.

The optical properties of the ALD molybdenum sulfide were measured using a Cary 5000 spectrophotometer (Varian) in transmission mode on films deposited on fused silica substrates. Kapton tape was placed on the backside of the quartz substrates during ALD and removed prior to measurement to mask off the region probed by the Cary 5000 beam. Prior to each measurement, a background reference was recorded to ensure accuracy. Linear regression of Tauc-plots was used to determine the optical band-gap of the films.

Thermodynamic calculations (HSC Chemistry, Outotec Oy) of the Gibbs free energies of reaction ($\Delta G$) were performed to evaluate possible chemical reactions occurring during the molybdenum sulfide ALD. Two plausible chemical pathways were identified: direct and indirect. In the direct pathway, $MoF_6$ and $H_2S$ react to form $MoS_2$, HF, and elemental S (Eq. (3)), with $\Delta G=-379$ kJ/mol at 200° C. In the indirect pathway, the initial solid-phase product is $MoS_3$ (Eq. (4)), with $\Delta G=-402$ kJ/mol at 200° C. Subsequent $H_2$ reduction (Eq. (5)) yields $MoS_2$, with $\Delta G=-24$ kJ/mol at 350° C. We compute $\Delta G$ at 350° C. for Eq. (5) to match the experimental conditions used in the postdeposition annealing. We note that the indirect pathway has a greater thermodynamic driving force ($\Delta G=-426$ kJ/mol) compared to the direct pathway ($\Delta G=-379$ kJ/mol). Moreover, the direct pathway might have a larger activation energy given the requirement for Mo reduction (+6 to +4) in Eq. (3), and so the indirect pathway might be kinetically favored as well. These mechanistic considerations will come into play later in our data analysis.

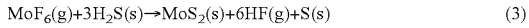

$$MoF_6(g)+3H_2S(s)\rightarrow MoS_2(s)+6HF(g)+S(s) \quad (3)$$

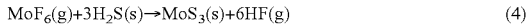

$$MoF_6(g)+3H_2S(s)\rightarrow MoS_3(s)+6HF(g) \quad (4)$$

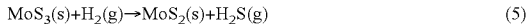

$$MoS_3(s)+H_2(g)\rightarrow MoS_2(s)+H_2S(g) \quad (5)$$

Figure 1A:
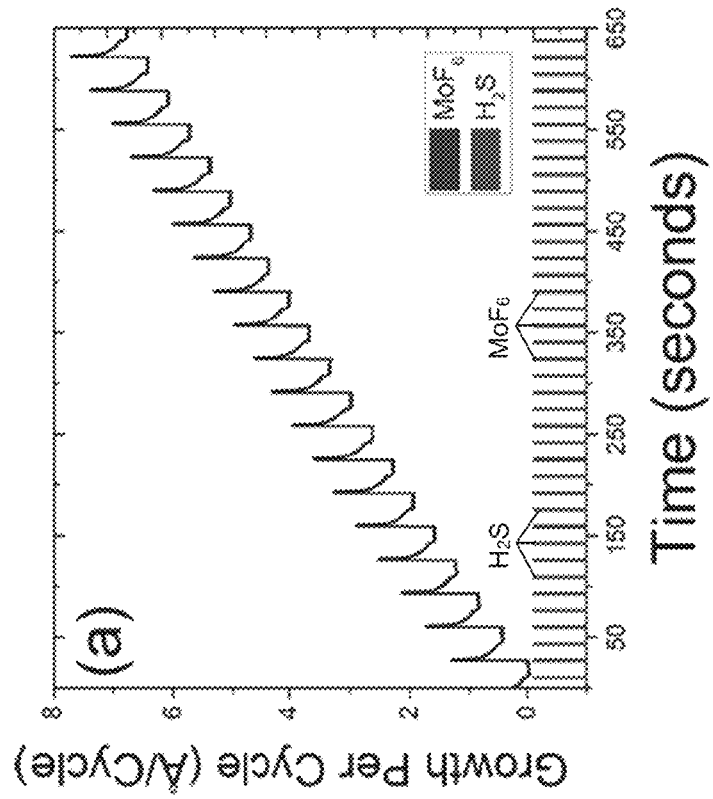

Initial QCM studies were performed to probe the degree of self-limitation for the $MoF_6$ and $H_2S$ half-reactions. FIG. 1A shows the in situ QCM measurements (red circles) recorded using the timing sequence x-5-1-5, where the $MoF_6$ exposure time was varied between x=0-2 s. The growth per cycle values were calculated assuming a bulk density of $MoS_2$, d=5.06 g/cm³. The QCM data were fit with a Langmuir adsorption curve (line) and demonstrate saturation after ~1 s $MoF_6$ exposure time at 0.4 Å/cycle. These measurements were repeated using the timing sequence 1-5-x-5, where the $H_2S$ exposure time was varied between x=0-2 s and revealed saturation after ~1 s $H_2S$ exposures at 0.40 Å/cycle (FIG. 1B). The data from FIGS. 1A-1B confirms the systematic self-limiting growth of $MoS_2$ during both $MoF_6$ and $H_2S$ doses, which is typical signature of good ALD method.

Figure 2A:
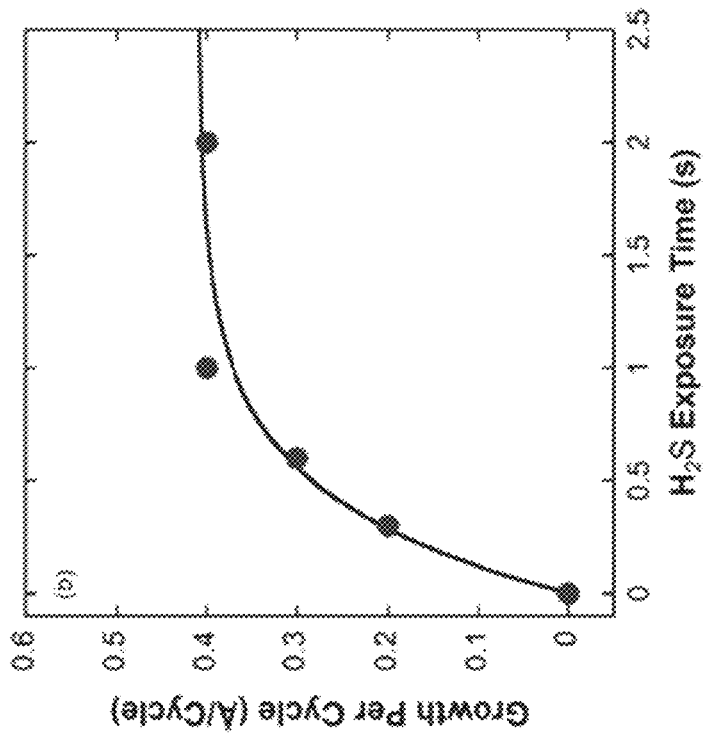
FIGS. 2A-2B show QCM data for molybdenum sulfide ALD varying $MoF_6$ dose time (FIG. 2A) and $H_2S$ dose time (FIG. 2B) using 5 s purge times and a constant 1 s dose times for the other precursor in both cases. Prior to these measurements, $MoF_6$ and $H_2S$ were pulsed using a (1.5-15-1.5-15 s) timing sequence until steady state growth was achieved at 200° C.
Figure 2B:
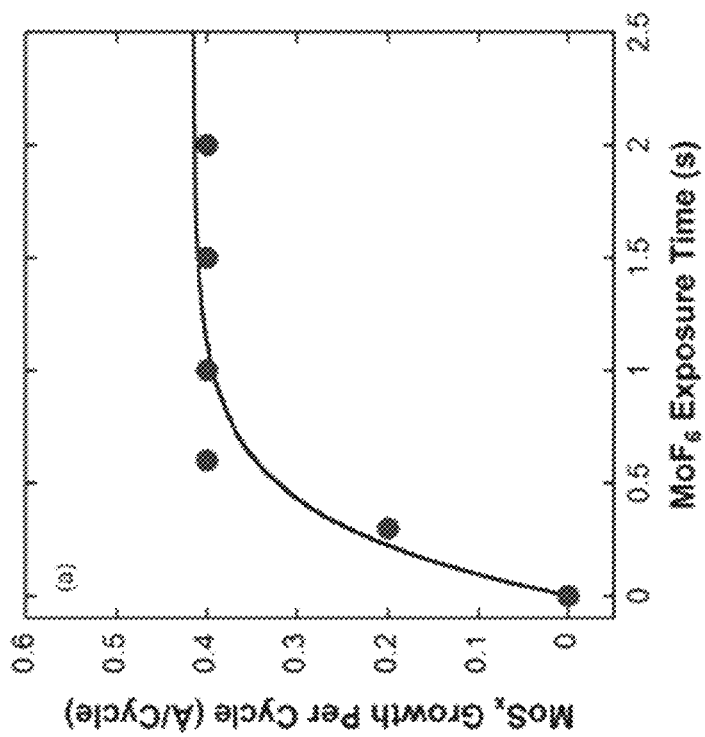

FIGS. 2A-2B show the in situ QCM measurements during molybdenum sulfide ALD at 200° C. using the timing sequence 1.5-15-1.5-15 s. FIG. 2A shows a longer term view of over 19 ALD cycles. A steady growth rate associated with each cycle is seen. FIG. 2B illustrates an expanded view of two successive ALD cycles, allowing for a clearer image of the growth rate and timing relative to the pulses for each cycle. The $MoF_6$ and $H_2S$ dosing periods are indicated by the respective traces at the bottom of the graph. We found linear growth at a GPC of 0.46(±0.01) Å/cycle using d=5.06 g/cm³. This value is slightly higher than the GPC value of 0.40 Å/cycle from FIGS. 1A-1B and this discrepancy may relate to the longer dose times of 1.5 s used for both precursors in FIG. 2A, while in FIG. 1A one of the precursor dose times was fixed at 1.0 s. The data from FIGS. 1A-1B confirms the systematic mass addition due to the deposited material and linear growth of $MoS_2$ as a function of number of ALD cycles (time).

The data in FIG. 2A show a regular staircase pattern that coincides with the precursor dosing times. FIG. 2B shows a magnified view of the QCM data for the first two ALD cycles. We see that the thickness (or mass) increases abruptly during the $MoF_6$ exposures and decreases abruptly during the $H_2S$ exposures. Furthermore, the mass decreases continuously during the $MoF_6$ purge periods and appears to approach a steady-state value. In contrast, the mass is constant during the $H_2S$ purge times. The slight delay between the QCM response and the precursor dosing traces results from the transit time of ~0.5 s required for the precursors to travel from the dosing valves to the QCM in our ALD system.

The relative mass changes produced by the $MoF_6$ and $H_2S$ exposures can be used to evaluate the molybdenum sulfide growth mechanism. If we assume that the molybdenum sulfide ALD proceeds via the direct route (Eq. (3)) and, furthermore, that the sulfur product sublimes from the surface, then we can propose the following surface reactions:

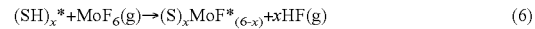

$$(SH)_x^*+MoF_6(g)\rightarrow(S)_xMoF^*_{(6-x)}+xHF(g) \quad (6)$$

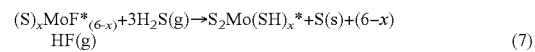

$$(S)_xMoF^*_{(6-x)}+3H_2S(g)\rightarrow S_2Mo(SH)_x^*+S(s)+(6-x)HF(g) \quad (7)$$

where surface species are designated with "*," and all other species are in the gas phase. In Eq. (6), $MoF_6$ reacts with x surface thiol (SH) groups liberating x HF molecules, so that (6−x) F atoms remain bound to the Mo. In Eq. (7), the new surface reacts with $H_2S$ to release the remaining (6−x) F atoms as HF and solid S. We hypothesize sulfur subsequently becomes a volatile species, probably in the form of $S_8$, while the surface has the newly formed $MoS_2$ species and is terminated with x SH groups so that the original surface functionality is restored. We note that the hypothesis of S sublimation is reasonable given that the vapor pressure of S is ~2 Torr at 200° C. We can define the QCM step ratio as $R=\Delta m_A/\Delta m$, where $\Delta m_A$ is the mass change from reaction Eq. (6) and $\Delta m$ is the mass change for one complete ALD cycle minus the sulfur species we assumed has entered the gas phase after the reaction. Given the atomic weights of the surface species, we can write $$R=\Delta m_A/\Delta m=(210-20x)/160 \quad (8)$$

The average step ratio from the QCM data in FIG. 2A is R=1.32(±0.05). From Eq. (8), this implies that x=0, meaning that there are no surface thiols involved in the ALD process, but rather the $MoF_6$ reacts leaving all six F atoms on the surface (some of which may bond to other nearby Mo atoms).

Alternatively, the molybdenum sulfide ALD may proceed via the indirect route (Eq. (4)), which suggests the following half-reactions:

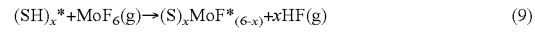

$$(SH)_x^*+MoF_6(g)\rightarrow(S)_xMoF^*_{(6-x)}+xHF(g) \quad (9)$$

$$(S)_xMoF^*_{(6-x)}+3H_2S(g)\rightarrow S_3Mo(SH)_x^*+(6-x)HF(g) \quad (10)$$

These reactions are identical to Eqs. (6) and (7), with the exception that all of the S remains on the surface and the ALD film has the composition $MoS_3$. Eqs. (9) and (10) yield the following QCM mass ratio:

$$R=\Delta M_A/\Delta M=(210-20x)/192 \quad (11)$$

Eq. (11) predicts R=1.09 for x=0, and R=0.47 for x=6. In other words, there is no x value that yields the experimental QCM step ratio R=1.32(±0.05), implying that the indirect pathway (Eq. (4)) is not correct. Given that the QCM data are consistent with the direct pathway (Eq. (3)), then a plausible interpretation for the gradual mass loss during the $MoF_6$ purge time is the slow sublimation of S from the surface.

Next, the growth rate and physical properties of the deposited TMD coating was investigated. FIGS. 3A-3B illustrate results of further experiments relating to embodiments of the deposited TMD. FIG. 3A shows film thickness as a function of $MoS_2$ ALD cycles as measured by ellipsometry. FIG. 3B is an SEM image of an as-deposited film after 600 cycles with a thickness of 45 nm (left) and annealed film (right). The inset of FIG. 3B shows a higher resolution SEM image of the as-deposited film. ALD reaction carried out at 200° C.

Figures 4A, 4B:
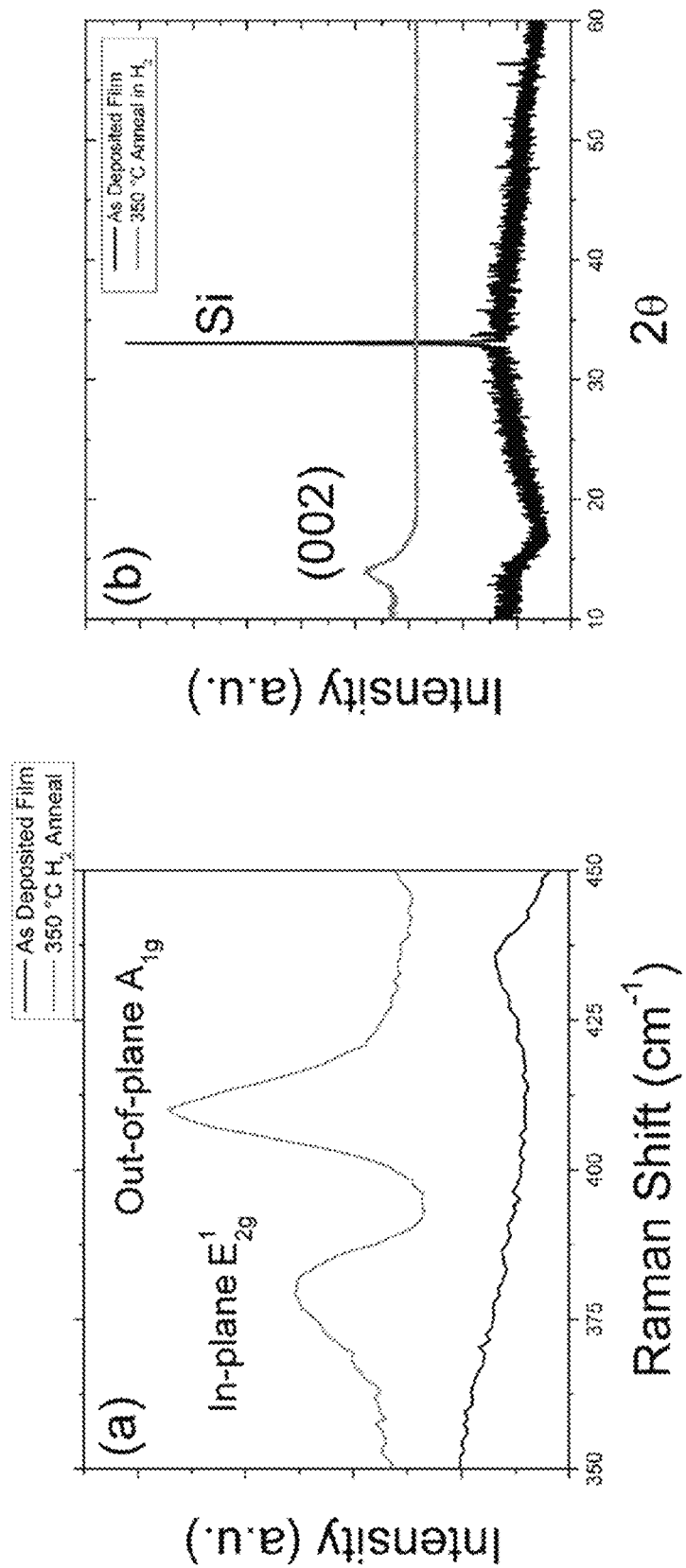
FIG. 4A is a Raman spectrum using a 514 nm excitation laser showing the as-deposited film (lower), which exhibits a $MoS_3$ peak at 435 $cm^{-1}$ and the annealed sample (upper) featuring clear $MoS_2$ fundamental peaks.
FIG. 4B is an X-ray diffraction pattern of the as-deposited and annealed sample. After annealing, the (002) reflection associated with the layered structure of $MoS_2$ is seen.

FIG. 4A shows Raman spectroscopy using a 514 nm excitation laser showing the as-deposited film (lower), which exhibits a $MoS_3$ peak at 435 $cm^{-1}$, and the annealed sample (upper) featuring clear $MoS_2$ fundamental peaks. FIG. 4B shows X-ray diffraction pattern of the as-deposited and annealed sample. After annealing, the (002) reflection associated with the layered structure of $MoS_2$ is seen. Both the Raman signal and X-ray diffraction peak position data confirms that as deposited layer is amorphous and the formation of high quality crystalline $MoS_2$ layer after $H_2$ annealing process.

A series of films were deposited on silicon and fused silica substrates using the 1-5-1-5 timing sequence at 200° C., varying the number of ALD cycles between 100 and 1000. The thicknesses of the films deposited on silicon were determined using spectroscopic ellipsometry, and these data are shown as the solid symbols in FIG. 3A. The line in FIG. 3A is a quadratic fit to the thickness data and demonstrates that the thickness does not increase linearly with cycles as expected for a layer-by-layer ALD process. The thickness after 100 cycles is 60 Å, and the thickness after 1000 cycles is 750 Å, so that the corresponding growth per cycle values are 0.60 and 0.75 Å/cycle, respectively. Both of these values are significantly higher than the value derived from in situ QCM in FIG. 2A of 0.46 Å/cycle where only 19 cycles were performed. It is evident that the growth per cycle for the ALD $MoS_2$ increases with thickness.

One explanation for this phenomenon can be found in the SEM image for the 600 ALD cycle film on silicon shown in FIG. 3B. This plan-view SEM image shows a rough morphology composed of flakes with lateral dimensions of 50-100 nm and thicknesses of ~10 nm. Additional SEM images recorded at an angle of 20° to the substrate normal (not shown) indicate that these flakes extend approximately vertically from the silicon substrate surface. We hypothesize that these flakes create a surface area that increases with increasing ALD cycles and this leads to greater $MoS_2$ deposition. This unusual morphology might result from faster growth at the edges of the $MoS_2$ sheets where the ALD precursors react with defect sites. Data from FIG. 3A confirms the growth of $MoS_2$ is very linear as number of ALD cycles and microstructure is uniform over the substrate.

Raman spectroscopy is a common method for identifying and characterizing $MoS_2$. FIG. 4A shows Raman spectra recorded from the 600 ALD cycle $MoS_2$ film on silicon using a 514 nm excitation laser as deposited (black line) and after the $H_2$ anneal (red line). The annealed $MoS_2$ film shows the characteristic peaks of the 2D material at 380 $cm^{-1}$ ($E_{2g}$, in-plane) and 410 $cm^{-1}$ ($A_{1g}$, out-of-plane). In contrast, the as-deposited film does not show these characteristic 2D $MoS_2$ peaks but rather shows a weak peak at ~435 $cm^{-1}$. This suggests that the as-deposited films are not stoichiometric $MoS_2$, or that they lack short-range order.

Pre-annealed samples showed an amorphous film when measured by XRD; however, after annealing, $MoS_2$ could be seen, featuring the (002) reflection, which arises from the layered structure. The XRD data from $MoS_2$ are consistent with the Inorganic Crystal Structure Database PDF 01-073-1508 for the interplanar spacing.

Figures 5A, 5B:
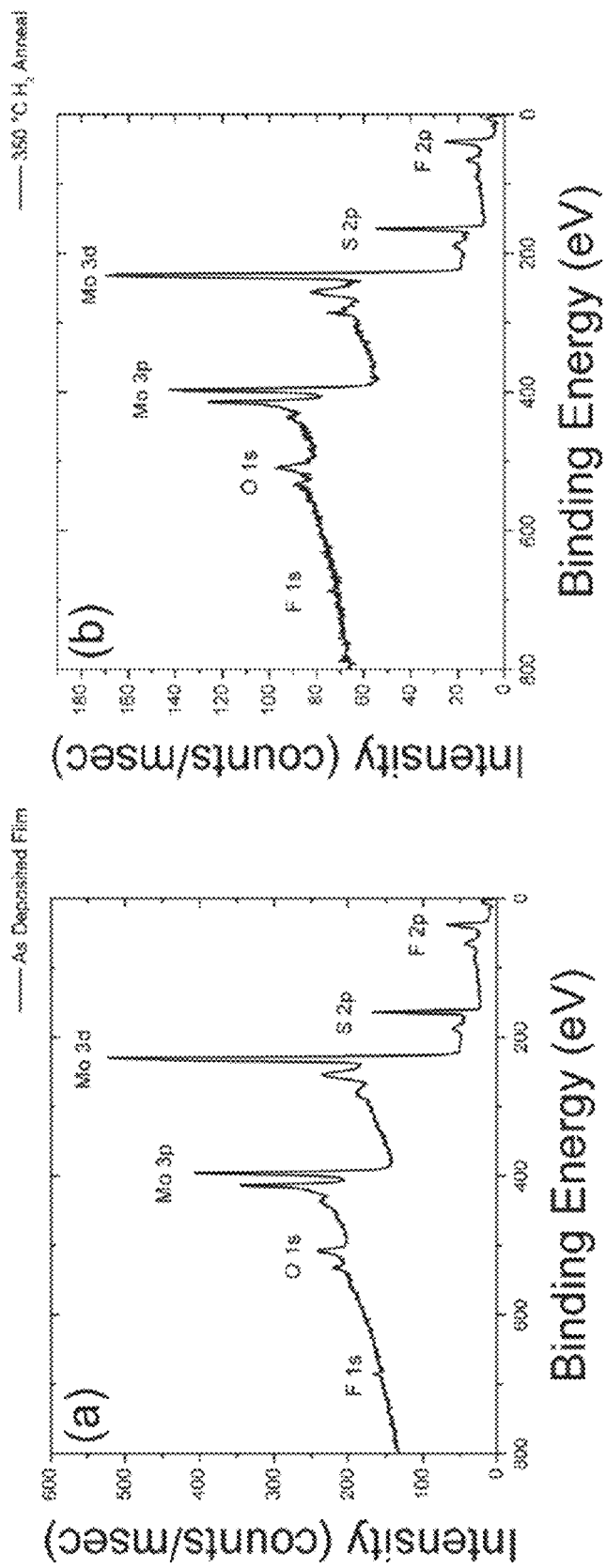
FIGS. 5A-5B show X-ray photoelectron spectroscopy (XPS) survey spectra of as-deposited ALD $MoS_x$ film (FIG. 5A) and same film after annealing in $H_2$ (FIG. 5B).

XPS measurements were performed on both the as-deposited films and the films annealed in $H_2$ to investigate the chemical composition. These films were prepared using 600 ALD cycles with a thickness of 45 nm. FIGS. 5A-5B show low-resolution survey scans for the as-deposited (FIG. 5A) and annealed (FIG. 5B) films. These spectra show that F, O, Mo, and S were present in the films and the relative concentrations are given in Table 2 below. The F detected by XPS likely results from unreacted $MoF_x$ species in the film. We believe that the O results from exposing the substrates to air. The $MoS_2$ films were removed from the ALD reactor at 200° C., and oxidation of monolayer $MoS_2$ has been shown to occur as low as 100° C. The concentrations of both the F and O decrease during the $H_2$ anneal.

High-resolution XPS data from the Mo 3d and S 2p regions before and after $H_2$ anneal are shown in FIGS. 6A-6D. The energies of the Mo 3d and S 2p peaks were consistent with chemically exfoliated $MoS_2$ samples. These spectra indicate that there exists $MoS_2$ and substoichiometric ($MoS_x$) environments due to the presence of an oxide phase after exposure of the samples to ambient air. The cause for the substoichiometric $MoS_2$ ($MoS_x$, where x<2) is associated with $MoS_2$ dilution in an oxidized Mo ($MoO_x$) phase, generating a possible mixed (Mo—$O_x$—$S_x$) molybdenum oxysulfide species. In fact, oxygen is known to have a high reactivity with the edge defects found in $MoS_2$ nanoflakes, which are also found in the present work (FIG. 3B). Based on the overall composition of Mo and S (Table 1), the presence of a mixed Mo(IV) and Mo(V/VI) environment contributes to the small S/Mo ratios of 1.1 and 1.35 for the as-deposited and annealed samples, respectively. Again, this is not surprising given the strong precedence for the stability of $MoO_2$ and $MoO_3$ species at temperatures below 550° C. compared to $MoS_2$, even when sulfurization is undertaken. After analysis of the high-resolution Mo 3d peak envelope (FIG. 6A), the integrated peak areas of the peaks corresponding to the spin-orbit split $3d_{5/2}$ and $3d_{3/2}$ contributions for $MoS_2$ (~228 and ~231, respectively) relative to the neighboring S—Mo—$O_x$/Mo—$O_x$ doublet (~229 and ~232 eV, respectively) in the as-deposited and annealed samples increased by 36% and 50%, respectively. Thus, the higher relative amount of $MoS_2$ after annealing the films in $H_2$ at 350° C. corroborates the appearance of the (002) diffraction peak in the XRD pattern (FIG. 4B), which is characteristic of layered $MoS_2$. Examination of the high-resolution S 2p XPS peak envelope for both the as-deposited (FIG. 6C) and annealed samples (FIG. 6D) demonstrates the presence of only $S^{2-}$ with spin orbit split $2p_{1/2}$ and $2p_{3/2}$ contributions arising at 162.9 and 161.7 eV, respectively. It can be concluded that, in addition to removing residual F arising from the $MoF_6$ precursor, the postannealing procedure was effective in removing some of the oxygen from the stable Mo—$S_x$—$O_x$ phase, which yielded a purer distribution of $MoS_2$ with more dominant contributions attributed to Mo(IV) in the Mo 3d XPS region.

TABLE 2

Atomic percentages as determined by XPS.

| Sample | Mo | S | F | O |
|---|---|---|---|---|
| As-deposited | 34.03 | 37.61 | 4.37 | 16.2 |
| Annealed | 36.54 | 48.9 | 1.22 | 12.7 |

To summarize, XRD suggests that the as-deposited film is amorphous whereas the SEM image shows what appear to be nanocrystals. It is likely that the diffraction peaks from these nanocrystals are too weak or broad to be detected by our XRD. The Raman measurements do not indicate crystalline $MoS_2$ as-deposited, and this may result from the residual F detected in the films by XPS. Finally, XPS indicates predominantly Mo(IV), and this agrees with the in situ QCM measurements that suggested $MoS_2$ is the reaction product.

Figure 7B:
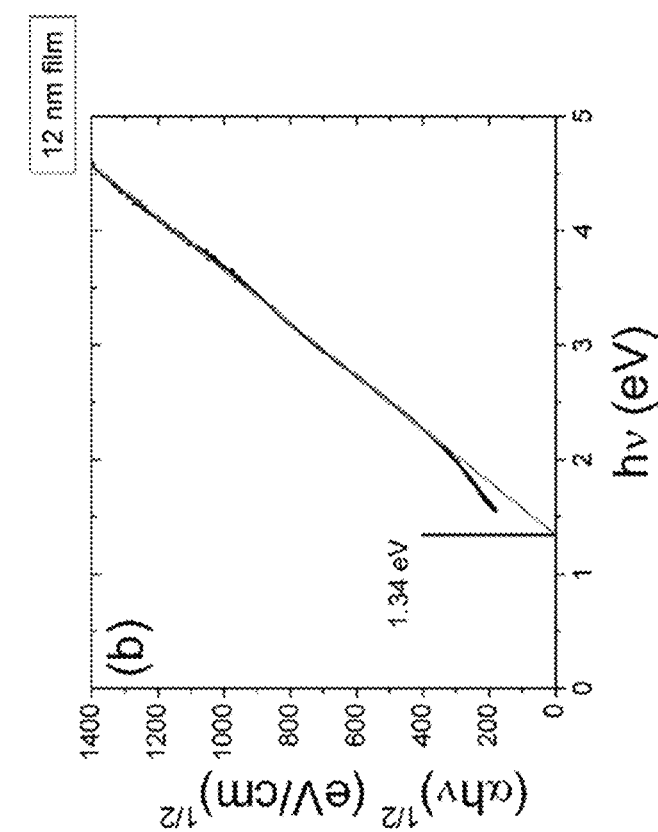
FIG. 7B is a linear regression in the Tauc-plot of the 12 nm sample. A band-gap of approximately 1.3 eV was found.
Figure 7A:
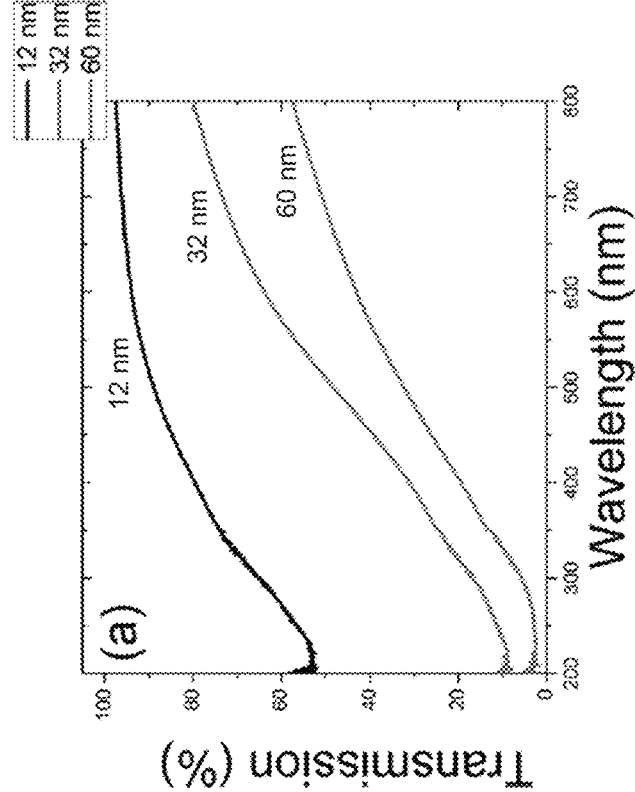
FIG. 7A shows ultraviolet-visible (UV-vis) transmission measurements of ALD $MoS_2$ films on fused silica substrates. Clear absorption of the resulting film is seen.

To measure the optical properties of the films, we used fused silica substrates that were masked with Kapton tape preventing deposition from occurring on one side. This process simplified the optical measurements since the beam was only interacting with a single film. FIG. 7A shows transmission data for ALD $MoS_2$ films of 12, 32, and 60 nm thickness measured over the visible spectrum in specular transmission mode. FIG. 7B shows a fit to the 12 nm sample using a Tauc model assuming a direct, allowed transition, and the intercept of this line yields a band-gap of approximately 1.34 eV. This value agrees with literature values for bulk $MoS_2$.

Further, an average steady state growth rather was observed. FIG. 3A illustrates the growth rate as a function of the $H_2S$ dose time, while FIG. 3B illustrates the growth as a function of the $MoF_6$ dose time. Both parameters resulted in a stead state growth rate of about 0.42 angstroms. As can be seen, the increase in growth rate leveled off for each precursor at a certain dosage time. This likely represents the saturation of the surface or at least the available binding/reaction sites.

We have shown that when using $MoF_6$ and $H_2S$ as ALD precursors, self-limiting growth of x-ray amorphous $MoS_2$ is attainable. Two routes of growth were proposed: indirect ($MoS_3$) and direct ($MoS_2$). The $MoS_3$ route is thermodynamically favorable; however, QCM measurement showed that the direct route was the most plausible route. Moreover, XPS data confirmed the as-deposited films were $MoS_2$. While molybdenum oxide was present, this was attributed to air exposure of the samples upon removal from the reactor at elevated temperature. After hydrogen annealing, crystalline $MoS_2$ x-ray peaks and Raman peaks were visible.

Enhancement of $MoS_2$ ALD Using ZnS

Figures 8A, 8B:
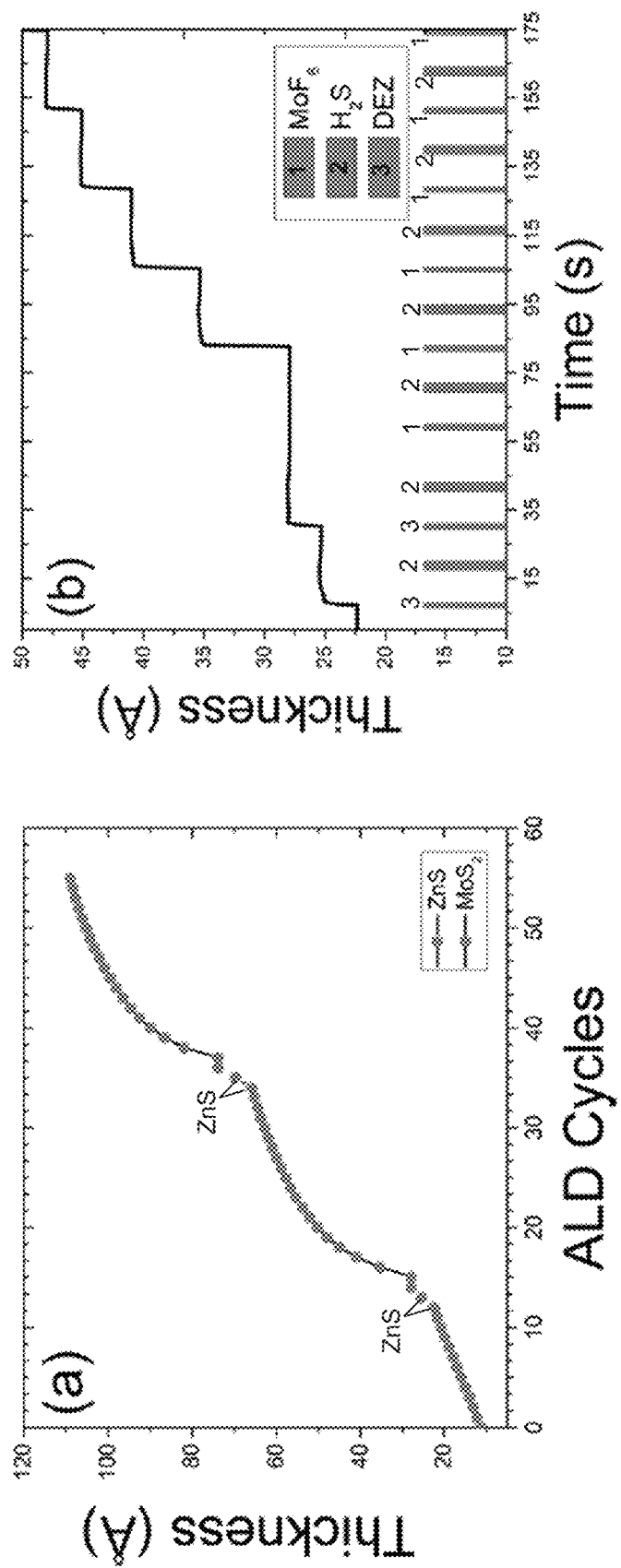
FIG. 8A shows QCM thickness vs ALD cycles for the repeated sequence of 2 cycles zinc sulfide (ZnS) ALD followed by 20 cycles $MoS_2$ ALD.
FIG. 8B is an expanded view of cycles 9-13 plotted as thickness vs time, highlighting the detailed mass changes during the transition from ZnS ALD to $MoS_2$ ALD. The diethyl zinc (DEZ), $MoF_6$, and $H_2S$ dosing times are indicated by the traces at the bottom of the graph.

As previously discussed, $WS_2$ ALD using $WF_6$ and $H_2S$ can be accelerated by periodically dosing DEZ and $H_2S$ to form a monolayer of ALD ZnS. To explore whether this same phenomenon occurs during $MoS_2$ ALD using $MoF_6$ and $H_2S$, we performed in-situ QCM measurements. FIG. 8A shows the mass versus time recorded by in situ QCM using the timing sequence 1-10-2-10 for the $MoS_2$ ALD and 1-10-2-10 for the ZnS ALD. In these experiments, two ZnS ALD cycles were performed followed by 20 $MoS_2$ ALD cycles, and this pattern was repeated several times. As shown in FIG. 8A, each time the ZnS ALD is performed, the subsequent $MoS_2$ ALD is enhanced for the next 5-6 cycles and then decreases back to a steady state GPC value of ~0.4 Å/cycle. This behavior is believed to be for the same reasons as for $WS_2$ ALD, and it is speculated that surface Zn might act as a catalyst to reduce the $WF_6$ and form ZnF, which is converted back to ZnS by exposure to $H_2S$.

Additional details can be gained from FIG. 8B, which shows an expanded view of FIG. 8A between 9 and 13 cycles as a plot of thickness versus time. The first two ALD ZnS cycles deposit ~2 Å/cycle as expected, but the very first $MoS_2$ ALD cycle following the ZnS deposits essentially zero mass. The second and third $MoS_2$ ALD cycles deposit 3.7 and 2.8 Å/cycle, respectively, which are seven to nine times higher than the steady-state value of 0.4 Å/cycle. Moreover, the step shape for these initial $MoS_2$ ALD cycles are much different from the steady-state step shape shown in FIG. 2B, indicating different surface chemistry for the $MoS_2$ ALD half-reactions on the ZnS surface. Previous studies of $WS_2$ ALD found $ZnF_2$ crystals in the $WS_2$ coating and speculated that reduction of the $WF_6$ by surface Zn might accelerate the $WS_2$ ALD. However, this hypothesis fails to account for the first $WS_2$ ALD cycle, which showed no growth. One explanation for the previous work and the present study is that the initial $MoF_6$ exposure both adds and removes material from the surface such that the net mass change is nearly zero. For instance, the $MoF_6$ might react with surface ZnS to yield a volatile sulfide-fluoride compound:

$$ZnS + MoF_6(g) \rightarrow ZnF_2 + MoSF_4(g) + H_2S \qquad (12)$$

This reaction produces only a 6 amu mass change. Although very little is known about $MoSF_4$, the analogous reaction with ZnO to form $ZnOF_4$ is thermodynamically favorable (−116 kJ/mol at 200° C.), and the $ZnOF_4$ is highly volatile (>1000 Torr at 200° C.). This etching reaction would explain the $ZnF_2$ residue in the previous papers. Additional in-situ measurements including quadrupole mass spectrometry to identify the gas phase products and Fourier transform infrared (FTIR) absorption spectroscopy to evaluate the surface functional groups directing the surface reactions would help to understand better the surface chemistry for the ZnS—$MoS_2$ ALD.

Similar to the $WS_2$ accelerated growth on ZnS, DEZ substitution of $MoF_6$ pulses accelerated the $MoS_2$ growth. Our QCM measurements suggest that an etching reaction involving volatile $MoSF_4$ species may occur and could explain earlier reports of $ZnF_2$ residues in $WS_2$. This work offers an alternative halogen-based process for carbon-free atomic layer deposition of $MoS_2$ at relatively low temperatures.

ALD of Other TMD Materials

In a further experiment, other TMD materials were synthesized, such as $MgS_2$ using $Mg(Cp)_2$ and $H_2S$ and $HfS_2$ using Hf $(TMAH)_4$ and $H_2S$. The ALD experimental conditions are shown in Table 3. The precursor dose and purge times are understood by those skilled in the art to be equipment-specific, and the values below were selected because they provided self-limiting ALD on the ALD tool used for these measurements.

TABLE 3

| No. | Parameters | Values for $MgS_2$ | Values for $HfS_2$ |
|---|---|---|---|
| 1 | Precursor | $Mg(Cp)_2$ and $H_2S$ | Hf $(TMAH)4$ and $H_2S$ |
| 2 | ALD cycles duration (metal precursor —$N_2$—$H_2S$—$N_2$) | Optimized (1-5-1-5 s) | Optimized (1-5-1-5 s) |

TABLE 3-continued

| No. | Parameters | Values for MgS$_2$ | Values for HfS$_2$ |
|---|---|---|---|
| 3 | Deposition temperature | 200° C. | 200° C. |
| 4 | Purge gas (N$_2$) flow | 300 sccm | 300 sccm |
| 5 | Thermal annealing (1Torr H$_2$) | 350° C. | |

Figure 9A:
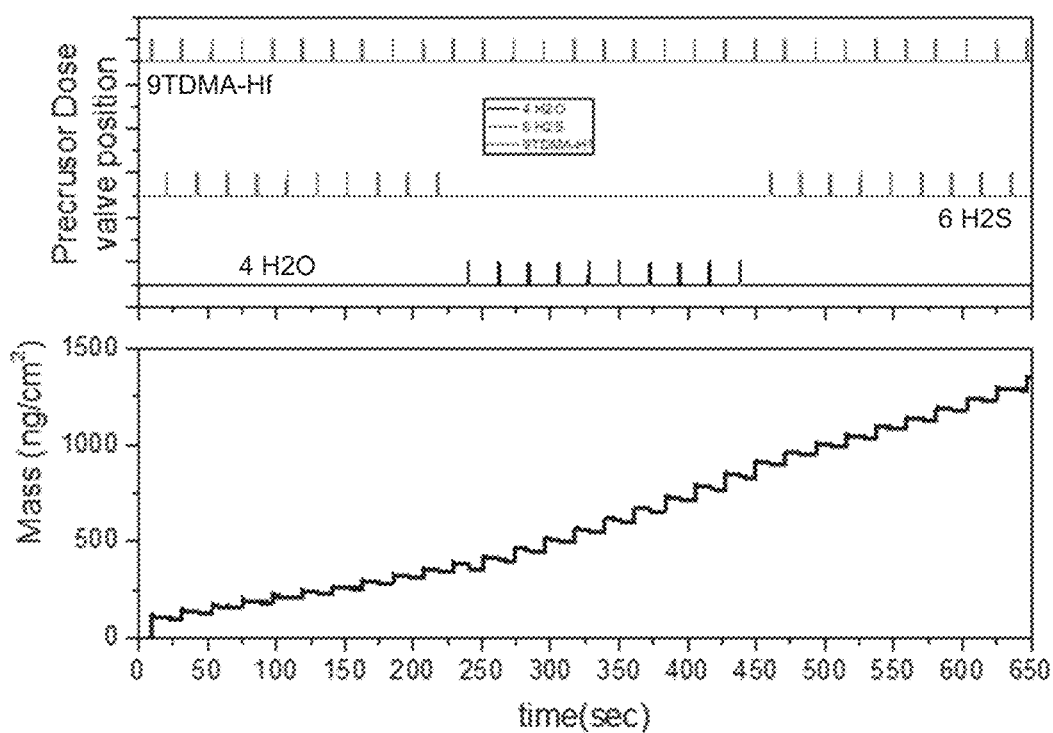
FIG. 9A shows QCM data for hafnium sulfide ($HfS_2$)-hafnium oxide ($HfO_2$) ALD using 10 s purge times and a constant 1 s dose times for the other precursor in both cases at 200° C. where the Hf precursor is tetrakis(dimethylamido) hafnium (TDMA-Hf).
Figure 9B:
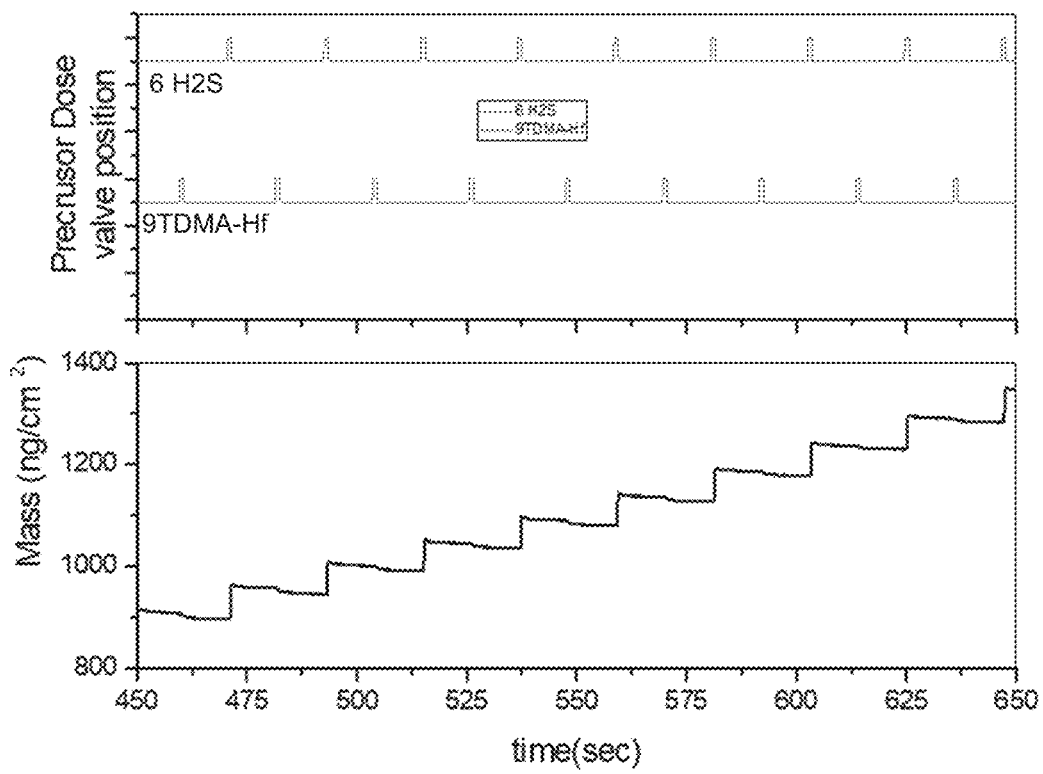
FIGS. 9B-9D show QCM data magnified for a few ALD cycles of $HfO_2$—$HfS_2$ at the interface from FIG. 9a. QCM data for $HfO_2$—$HfS_2$—$HfO_2$ used 10 s purge times and a constant 1 s dose times for the other precursor in both cases.
Figure 9C:
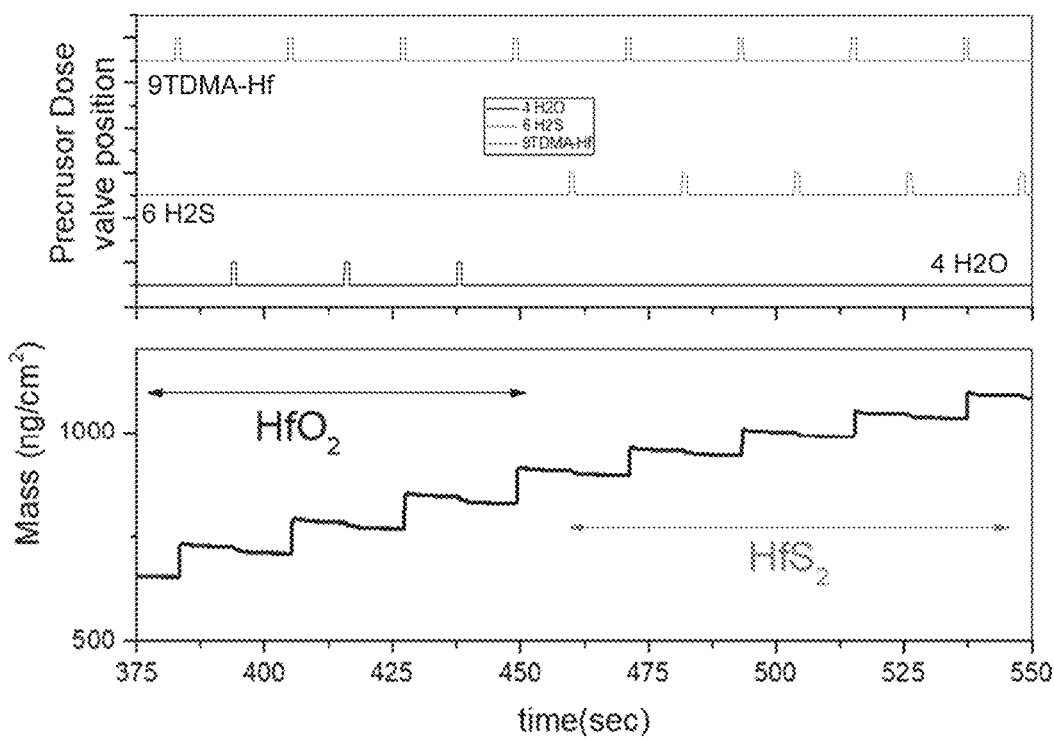
Figure 9D:
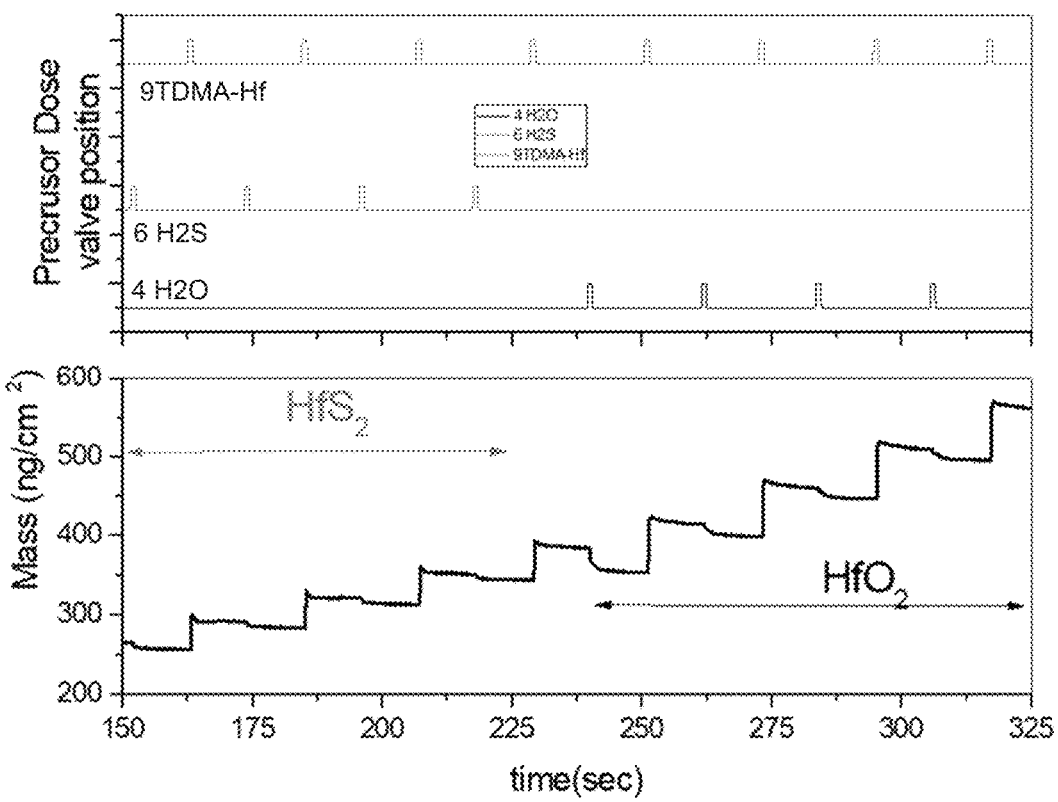

FIG. 9A shows QCM data for HfO$_2$—HfS$_2$—HfO$_2$ 10 s purge times and a constant 1 s dose times for the other precursor in both cases at 200° C. FIG. 9B shows QCM data magnified few ALD cycles of HfO$_2$—HfS$_2$ interface from FIG. 5A. QCM data for HfO$_2$—HfS$_2$—HfO$_2$ 10 s purge times and a constant 1 s dose times for the other precursor in both cases. From FIGS. 9A-9B, a linear steady state growth of HfS$_2$ was achieved. Further, it is clear that there is immediate growth of HfS$_2$ on HfO$_2$ and vice versa. The mass deposited per HfS$_2$ cycle=46 ng/cycle, whereas mass deposited per HfO$_2$ ALD cycle 58 ng/cycle. The immediate growth of HfS$_2$ on HfO$_2$ and vice versa can produce very clean interface, which needed and desired for semiconductor devices.

Figure 10A:
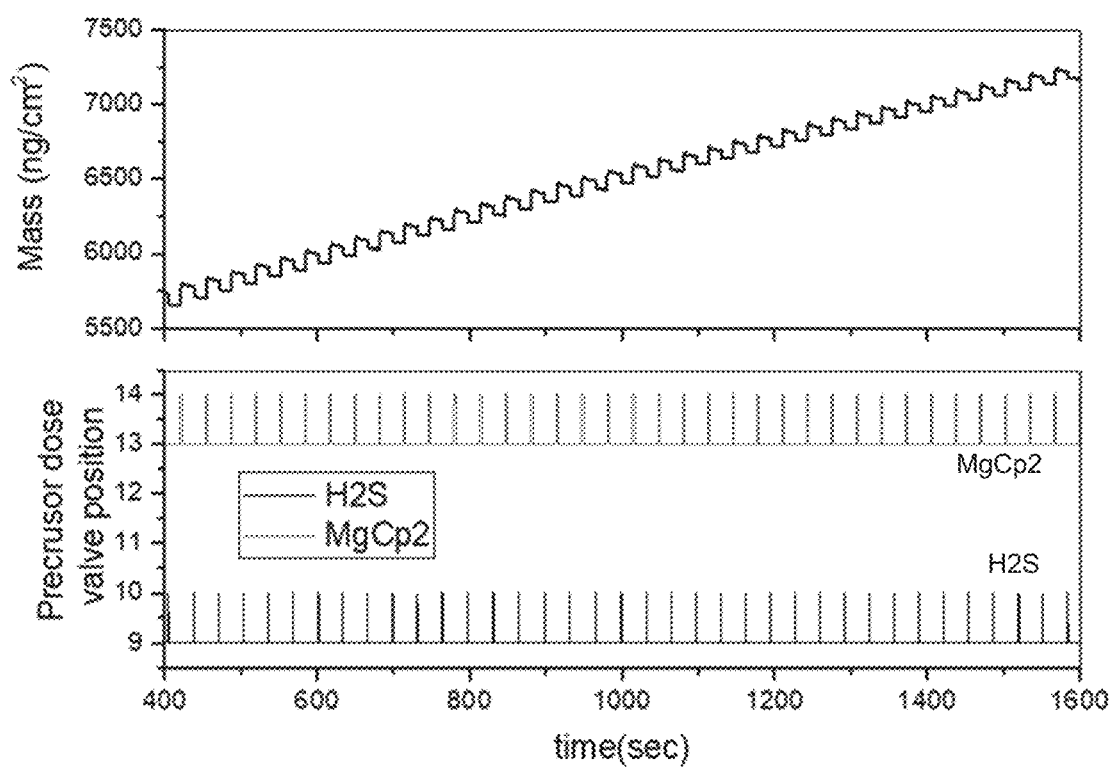
FIGS. 10A-10B show QCM data for magnesium sulfide ($MgS_2$) recorded using 10 s purge times and a constant 2 s dose times for bis-cyclopentadienyl magnesium ($MgCp_2$) and 0.5 s for $H_2S$ precursors at 200° C.
Figure 10B:
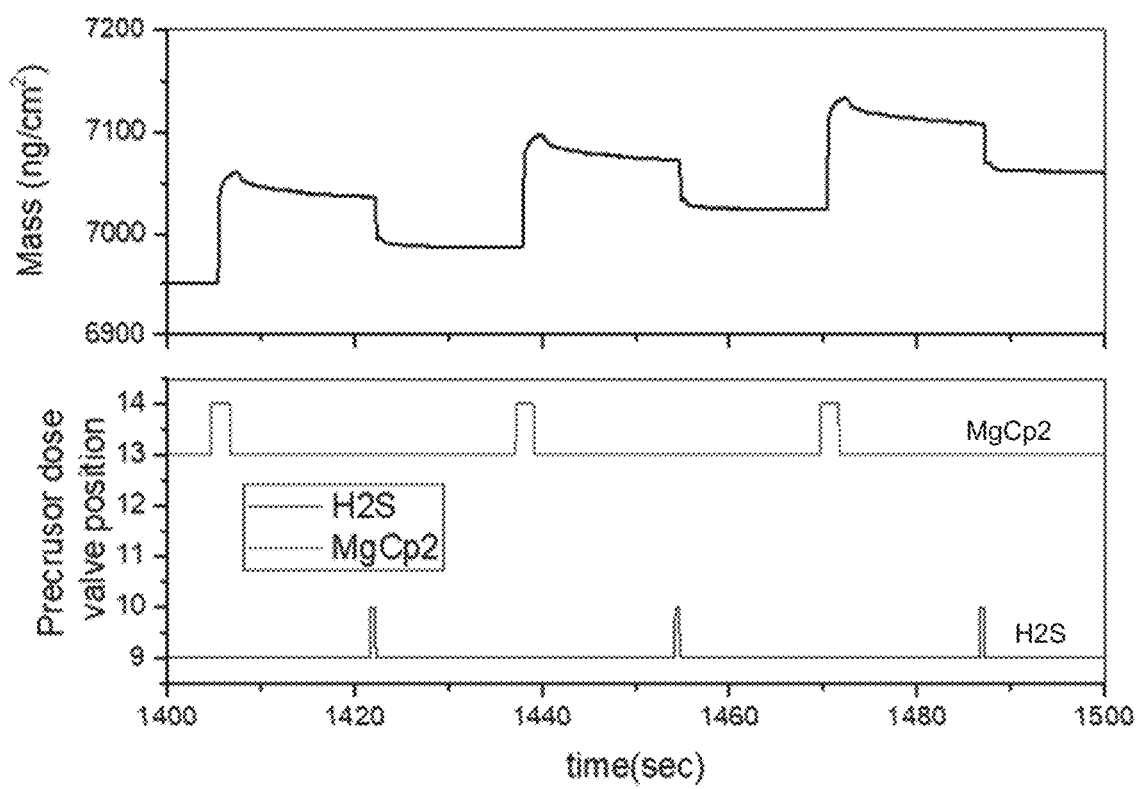

FIG. 10A shows QCM data for MgS$_2$ 10 s purge times and a constant 2 s dose times for MgCp$_2$ and 0.5 s for H$_2$S precursors at 200° C. FIG. 10B shows QCM data magnified few ALD cycles from FIG. 10A. QCM data for MgS$_2$ 10 s purge times and a constant 2 s dose times for MgCp$_2$ and 0.5 s for H$_2$S precursors. From FIGS. 10A-10B, a linear steady state growth of MgS$_2$ was achieved. The mass deposited per HfS$_2$ cycle=36 ng/cycle.

The similar ALD growth methodology can be apply to the other layer structure materials using transition metals (Mo, W, Cr, Hf, Zr, Co, Pt, V, Ti, Ta, Nb, or Lathanides elements and a chalcogen (S, Se, Te)). For example, one precursor for Mo is MoF$_6$ and one precursor for Hf is halfnium etrakis (dimethylamido)hafnium(IV). Thus, although different precursors may be used, the common aspect for the precursors is chalcogen precursor S. It is believed that having common chalcogen-rich surface for subsequent chemistry will help the next layer of material to grow, preferably with the with least nucleation delay.

The metal precursors can be halides, amides, cyclopentadienyl (Cp) compounds, substituted Cp compounds, alkyls, carbonyls, alkoxydes, or heteroleptic compounds containing mixtures of these various ligands. The chalcogenide can be a hydride, amide, tris-methyl silyl amide, alkyl, or a mixture of these ligands.

Compatible Deposition of Mo and MoS$_2$

Another concern for suitable TMD material on large-scale device integration is a suitable metal contact to the TMD layer. This issue can be deal with using metal Mo deposition on MoS$_2$ layer with clean interface. To demonstrate this, we have used ALD Mo and ALD MoS$_2$ on top of each other. The ALD experimental parameters are given in table below. It is understood by those skilled in the art that the ALD timings are instrument specific, the number of ALD cycles can be varied to suit the application, and the temperature for the metal can be varied within the ALD window for the Mo ALD. The range of MoS$_2$ temperatures is given above.

In one embodiment, ALD of Mo and ALD MoS$_2$ are process compatible due to use of same the same precursor for both growing metallic Mo and MoS$_2$, for example MoF$_6$. In addition, deposition temperature can be same or different for MoS$_2$ and Mo growth. Table 4 shows one set of parameters for the example embodiments of MoS$_2$ deposited and then coated with Mo by ALD:

TABLE 4

| No. | Parameters | Values for Mo | Values for MoS$_2$ |
|---|---|---|---|
| 1 | Precursor | MoF$_6$ and Si$_2$H$_6$ | MoF$_6$ and H$_2$S |
| 2 | ALD cycles duration | (MoF$_6$—N$_2$—Si$_2$H$_6$—N$_2$) Optimized (1-5-1-5 s) | (MoF$_6$—N$_2$—H$_2$S—N$_2$) Optimized (1-5-1-5 s) |
| 3 | Deposition temperature | 200° C. | 200° C. |
| 4 | Purge gas (N$_2$) flow | 300 sccm | 300 sccm |
| 5 | Thermal annealing (1Torr H$_2$) | Optional (350° C.) | |

Figure 11A:
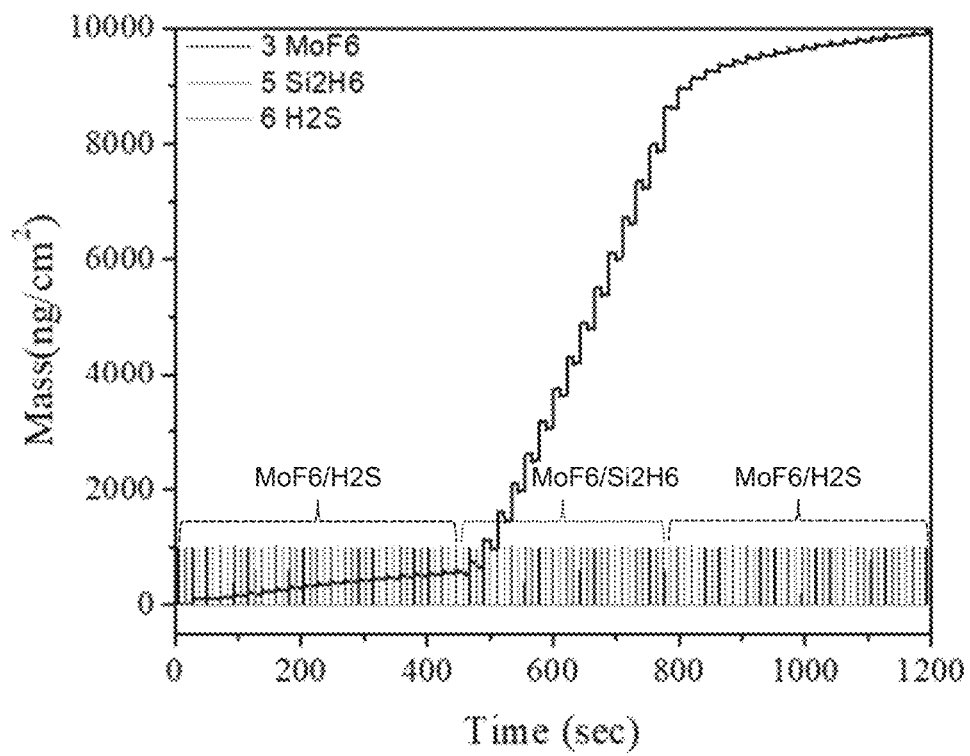
FIG. 11A shows QCM data for $MoS_2$—Mo—$MoS_2$ layers stack grown with 10 s purge times and 1 s dose times for the all $MoF_6$, disilane ($Si_2H_6$), and $H_2S$ precursors at 200° C.
Figure 11B:
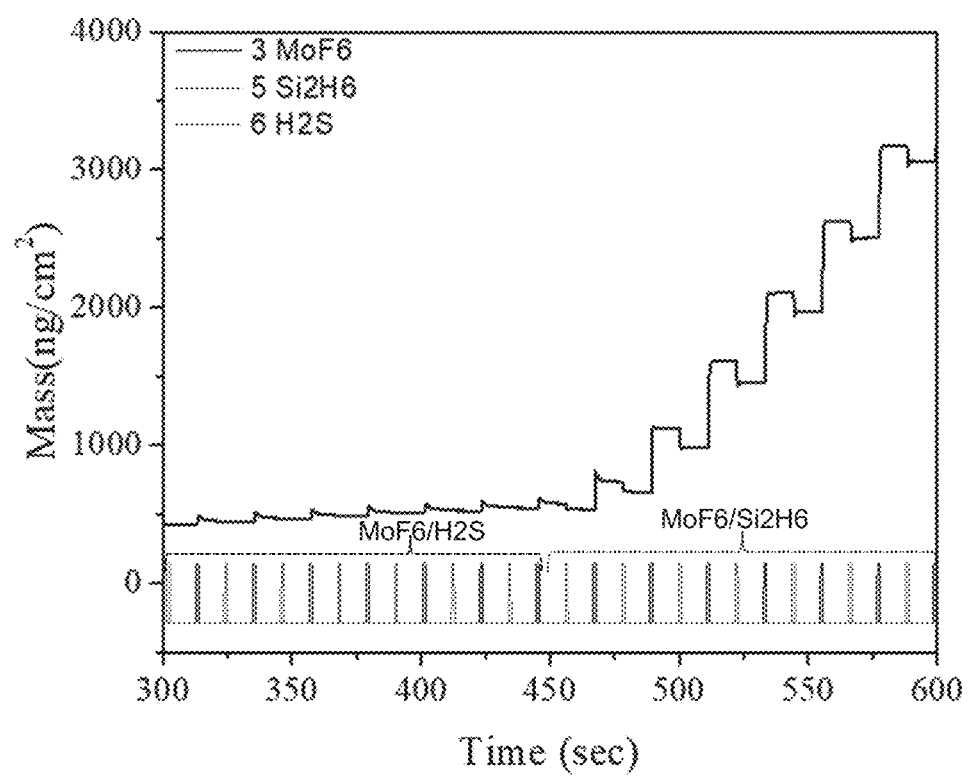
FIG. 11B shows expanded view QCM data for a $MoS_2$—Mo bilayer from FIG. 11A.
Figure 11C:
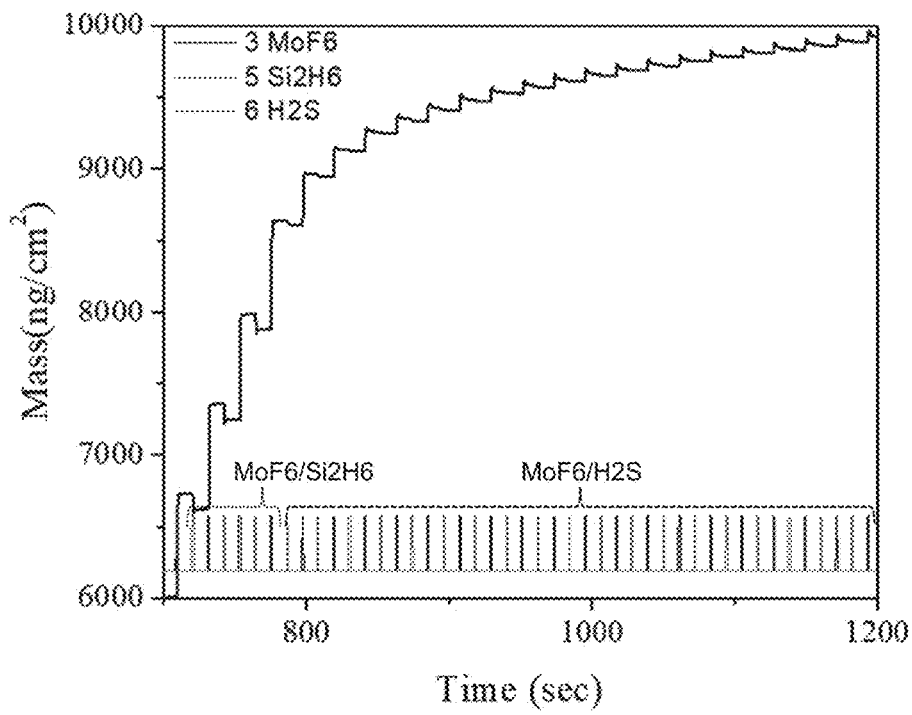
FIG. 11C shows expanded view QCM data for a Mo—$MoS_2$ bilayer from FIG. 11A.

QCM data was gathered for the resultant component. As seen in FIG. 11A, QCM data for MoS$_2$—Mo—MoS$_2$ layers show stack grown with 10 s purge times and 1 s dose times for the all MoF$_6$, Si$_2$H$_6$, H$_2$S precursors at 200° C. FIG. 11B shows QCM data for MoS$_2$—Mo layers stack section zoom in from FIG. 11A. FIG. 11C shows QCM data for Mo—MoS$_2$ layers stack section zoom in from FIG. 11A.

It is clear that from FIGS. 11A-11C that both Mo and MoS$_2$ can grow very immediately on top of each other with barely any nucleation delay. This process can able to produce clean interface between the MoS$_2$ and Mo contact layer. This process is also simplified because there are no additional elements involved in the process. Overall, this type proposed approach ALD methodology could produce efficient clean metal-metal sulfide stack in economical manner (e.g., in addition to this same ALD growth chamber can be used to deposit both metal Mo and MoS$_2$).

Etching of MoS$_2$

Precisely controlled removal of thin film layers is very essential for next generation high density 3D devices fabrication. There are several ways one can perform the etching the materials. For example:

A layer-by-layer etching [Atomic Layer Etching (ALEt), very precise but slow]

Chemical vapor etching (CVE) [aggressive but, if controlled, fast and economical]

Layer(s)-by-layer(s) etching [moderate etch rate and fast, as well as economical]

As 2D-layered TMD materials are advantageous for next generation microelectronics and to integrate TMDs into 3D devices on larger scale, it is important to have both 3D conformal growth and etch process capabilities. For example, ALD is suitable for growing precisely and highly conformally materials on high aspect ratio 3D structures, whereas a well-controlled ALEt is very much suitable for etching (removing) material conformally and precisely from the 3D structure.

Therefore, next we demonstrated the ALEt of MoS$_2$ which is unique way of etching the MoS$_2$. The developed method is very economical, well controlled, and can etch MoS$_2$ in atomic layer-by-layer removal manner. Further, the ALEt recipe that we have used here is based on the MoF$_6$—

$H_2O$ process. This means we can grow ALD $MoS_2$ using $MoF_6$ and $H_2S$ (as discussed earlier in FIGS. 1-4) in same material processing chamber we can perform ALEt $MoS_2$. This will reduce the cost of ownership not only having same material processing reactor but also the in terms of time and no need separate tool.

Figure 12A:
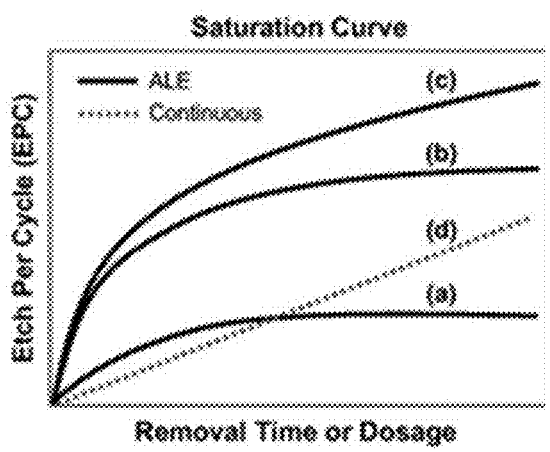
FIGS. 12A-12B are taken from the reference: *Journal of Vacuum Science & Technology A: Vacuum, Surfaces, and Films* 33, 020802 (2015).
Figure 12B:
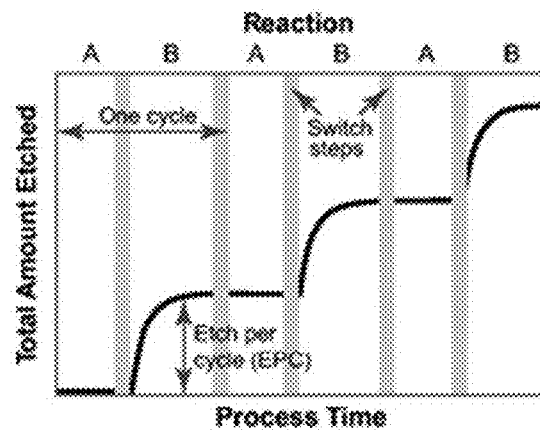

FIG. 12 shows atomic layer etching reference from *Journal of Vacuum Science & Technology A: Vacuum, Surfaces, and Films* 33, 020802 (2015). The overall idea of using ALEt method is to remove the desire material in well controlled and precisely as well as conformal from 3D structure. For next generation 3D devices, this is needed because conventional reactive ion etching is very much directional and line-of-sight process, which may not suitable for removing material from 3D sites.

Figure 13:
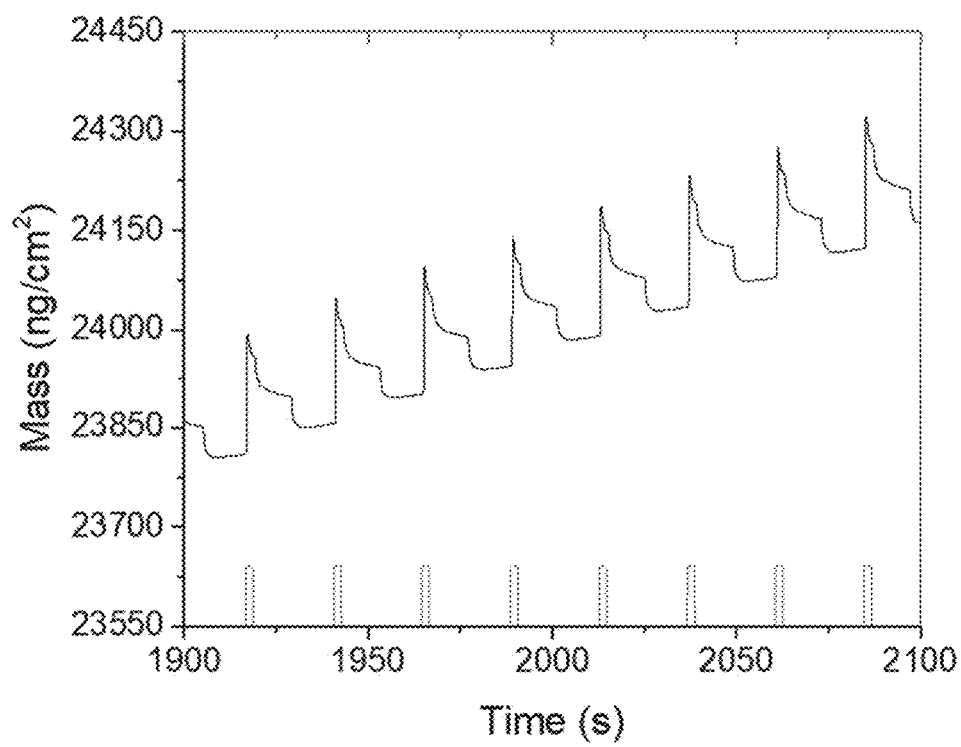
FIG. 13 shows QCM data recorded during the pulsed chemical vapor deposition (CVD) of Mo using successive $MoF_6$ exposures where each $MoF_6$ exposure deposits a fixed mass of Mo on the sensor.

FIG. 13 shows QCM data for only $MoF_6$ dose pulses (2 s) followed by (20 s) purge on substrate at 200° C. The pulsing of $MoF_6$ precursor only on substrate the ~45 ng/dose. This is due to $MoF_6$ precursor has thermal decomposition factor which resulted in mass add on substrate.

Figure 14:
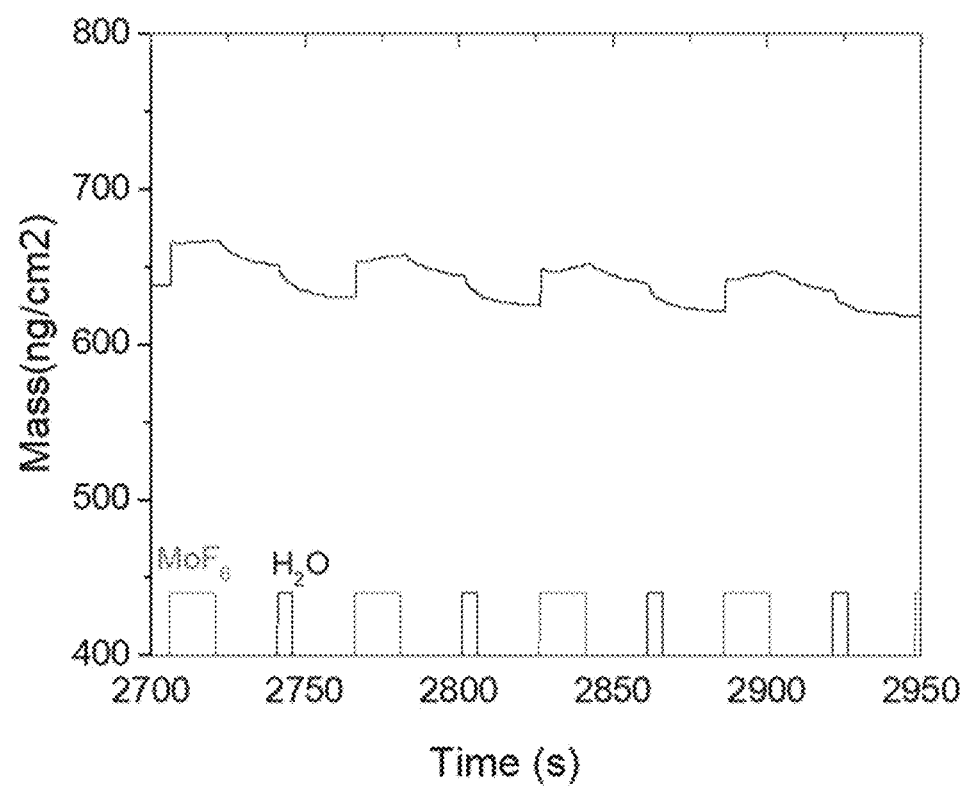
FIG. 14 shows QCM data for $MoF_6$—$H_2O$ dosing with cycle times of (15-20-5-20 s) on a substrate at 200° C. showing a net mass gain during each $MoF_6$ exposure and a mass loss during the subsequent $H_2O$ exposure such that the net mass gain from one $MoF_6$—$H_2O$ cycle is negative.

FIG. 14 shows QCM data for $MoF_6$—$H_2O$ dosing with cycle of (15-20-5-20) s on substrate at 200° C. The pulsing of $MoF_6$—$H_2O$ precursors did not give any reasonable mass add on QCM substrate. In this case, to our best knowledge both volatile HF and $MoF_xOy$ reaction product is forming there for there is no major mass deposition on the QCM substrate.

Figure 15A:
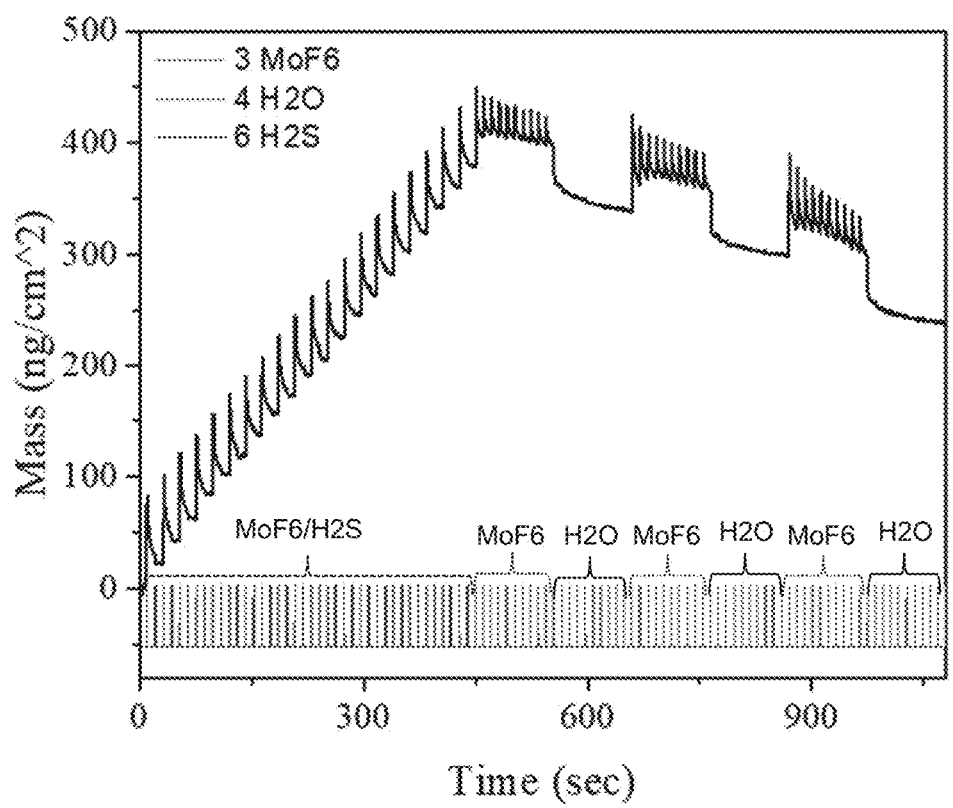
FIGS. 15A-15B relate to an embodiment of TCD deposition using $MoF_6$ and $H_2S$.
Figure 15B:
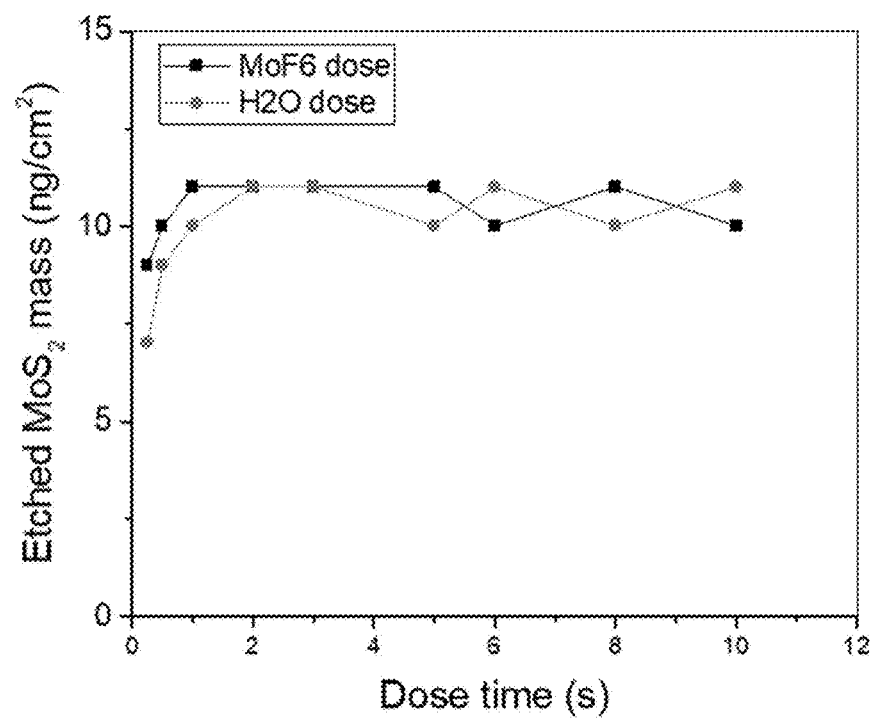

FIGS. 15A-15B show QCM for ALEt at 200° C. of ALD grown $MoS_2$ (FIG. 15A) both $MoF_6$ and $H_2O$ precursor microdosing (FIG. 15B) etching saturation as a function of both $MoF_6$ and $H_2O$ dose time. For both precursors purge time kept constant (20 s). Prior to etching ALD $MoS_2$ performed with $MoF_6$ and $H_2S$ were pulsed using ALD cycle of ($MoF_6$—$N_2$—$H_2S$—$N_2$)=(1-10-1-10) s timing sequence until steady state growth was achieved at 200 C. The data from FIGS. 15A-15B confirms the systematic self-limiting etching of $MoS_2$ during both $MoF_6$ and $H_2O$ doses, which is typical signature of ALEt method.

Figure 16:
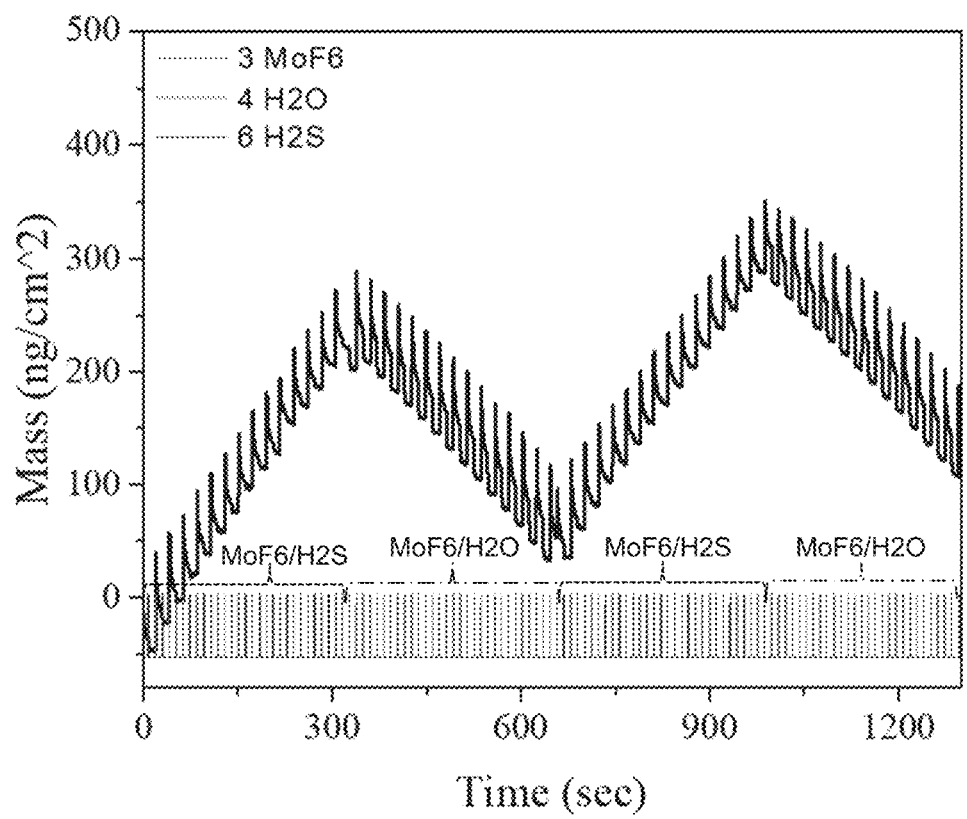
FIG. 16 shows QCM data for multiple iterations of $MoS_2$ ALD followed by $MoS_2$ ALE at 200° C. ALD $MoS_2$ was performed with $MoF_6$ and $H_2S$ with the timing sequence ($MoF_6$—$N_2$—$H_2S$—$N_2$)=(1-10-1-10 s) and $MoS_2$ ALE was performed using $MoF_6$ and $H_2O$.

FIG. 16 shows QCM for ALEt at 200° C. of ALD grown $MoS_2$ using $MoF_6$—$H_2O$ precursor's chemistry. Prior to etching, ALD $MoS_2$ performed with $MoF_6$ and $H_2S$ were pulsed using ALD cycle of ($MoF_6$—$N_2$—$H_2S$—$N_2$)=(1-10-1-10 s) timing sequence until steady state growth was achieved at 200° C. The data from FIG. 16 confirms that the ALEt method based on $MoF_6$—$H_2O$ precursors developed for $MoS_2$ etching is reproducible.

Figure 17:
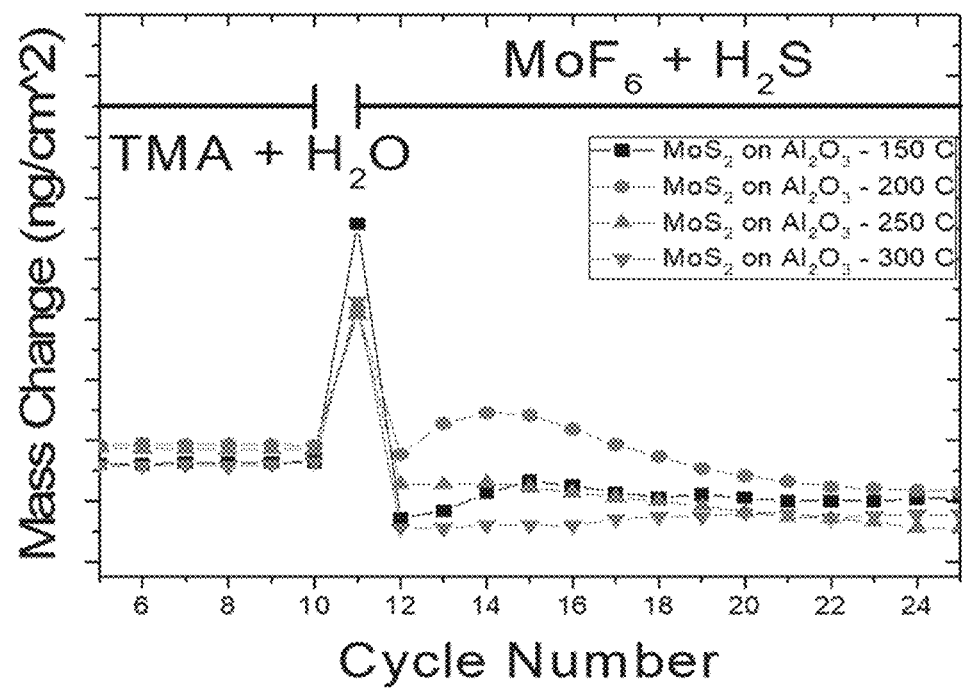
FIG. 17 shows the mass change over cycle time in relation to the deposition of $Al_2O_3$ and $MoS_2$.
Figure 18A:
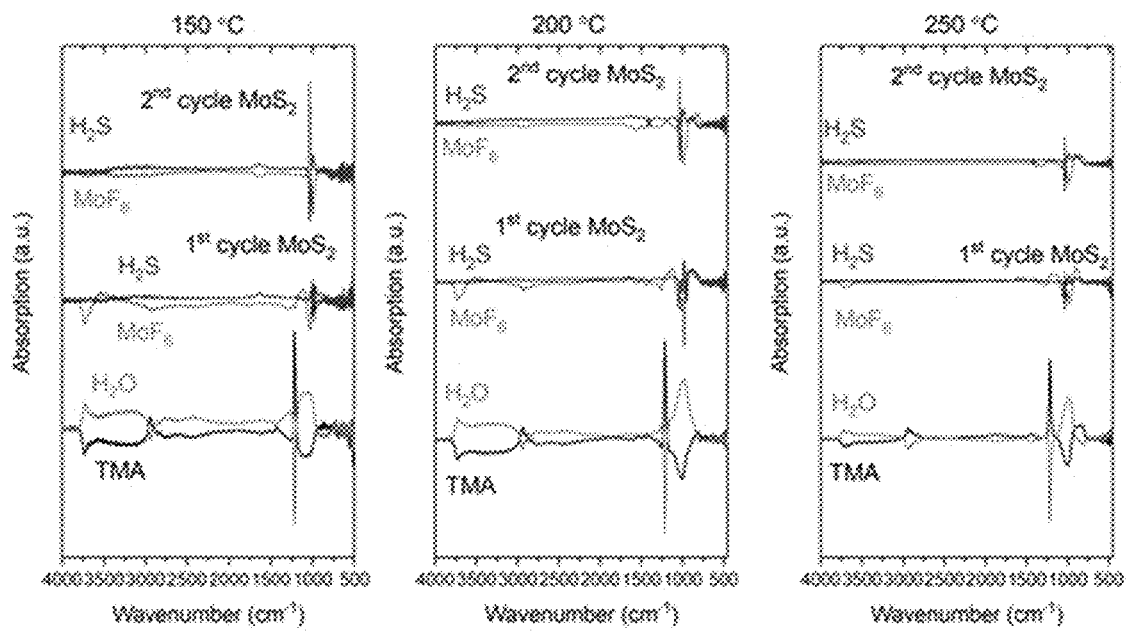
FIG. 18A shows FTIR difference scans of the last $Al_2O_3$ cycle at the bottom and the first two cycles of $MoF_6$ and $H_2S$.
Figure 18B:
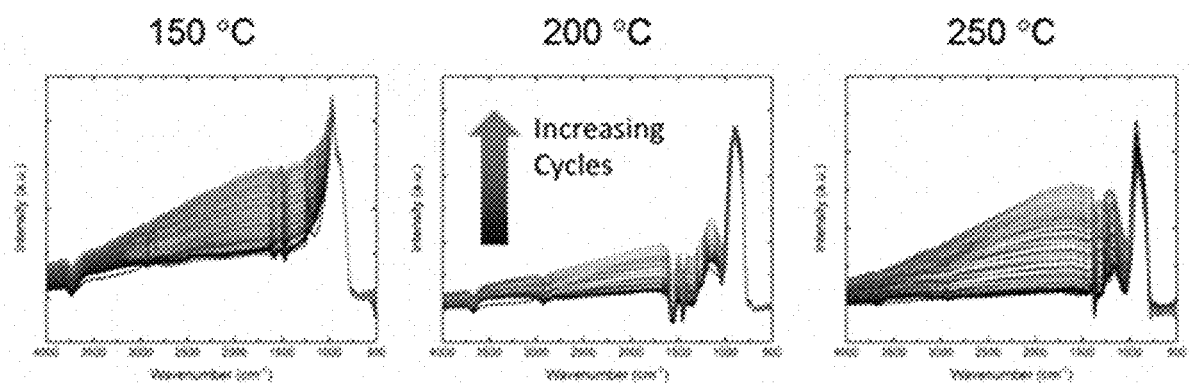
FIG. 18B shows each half cycle of $MoF_6$ and $H_2S$ on top of $HfO_2$, showing the background increase of the background absorption due to the increase in free carriers in the film.

FTIR is an excellent surface sensitive technique to further investigate and monitor the growth of ALD films. Performing the technique in situ allows for the investigation of how the surface species changes after each ALD half cycle. Performing the same experiment as in FIG. 17 (growing an $Al_2O_3$ surface followed by $MoS_2$), we can visualize the surface specie change plotted in FIG. 18A at 150, 200, and 250° C. To better visualize the changes in the surface chemistry the data is plotted as difference spectra, where each spectrum is subtracted from the previous. Peaks above the baseline represents the formation/addition of that surface species, while peaks below the baseline means a loss. The lowest two plots show the last TMA and $H_2O$ half cycles. The symmetrical nature of the plots suggest that the $Al_2O_3$ is growing in a steady state regime as previously reported in literature. The middle plots show the first cycle of $MoF_6$ and $H_2S$, represented by the blue and green lines, respectively. Features in the 3750-2800 $cm^{-1}$ region are associated with OH groups and are clearly negative confirming the reaction with surface OH groups during the first pulse of $MoF_6$. Lack of these on the second cycle (top spectra) indicated a change in surface chemistry, which corroborate our previously proposed thiol exchange growth mechanisms. While thiol vibrational modes can be visualized with FTIR, they are typically very weak and were not detected. We did observe an increase in the background absorption as the number of $MoF_6$ and $H_2S$ cycles increased (FIG. 18B). This would be expected if the free carriers in the film increase, and suggest $MoS_2$ is growing on top of the $Al_2O_3$.

Figure 19A:
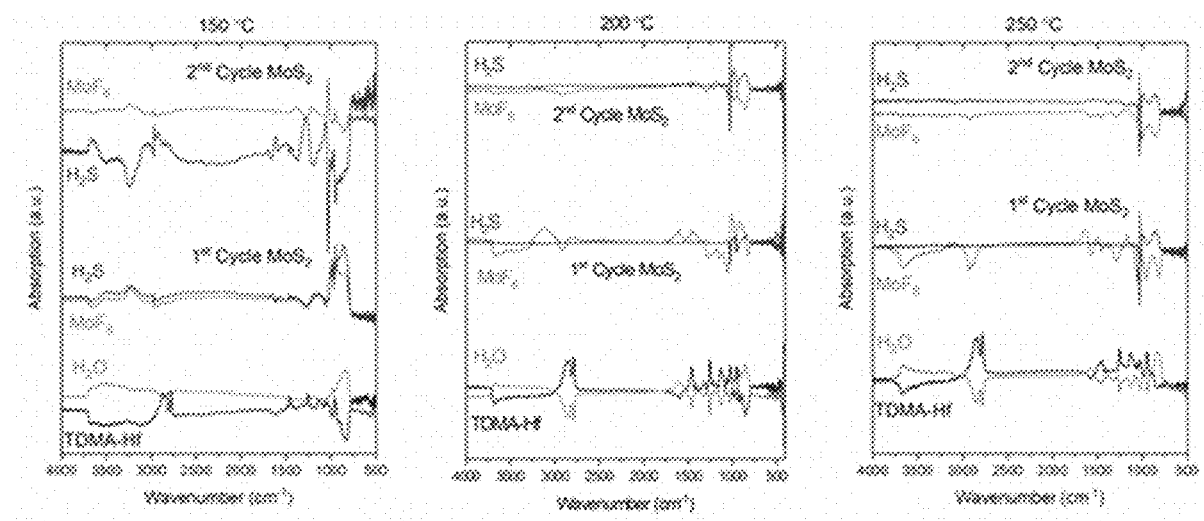
FIG. 19A shows FTIR difference scans of the last $HfO_2$ cycle at the bottom and the first two cycles of $MoF_6$ and $H_2S$.
Figure 19B:
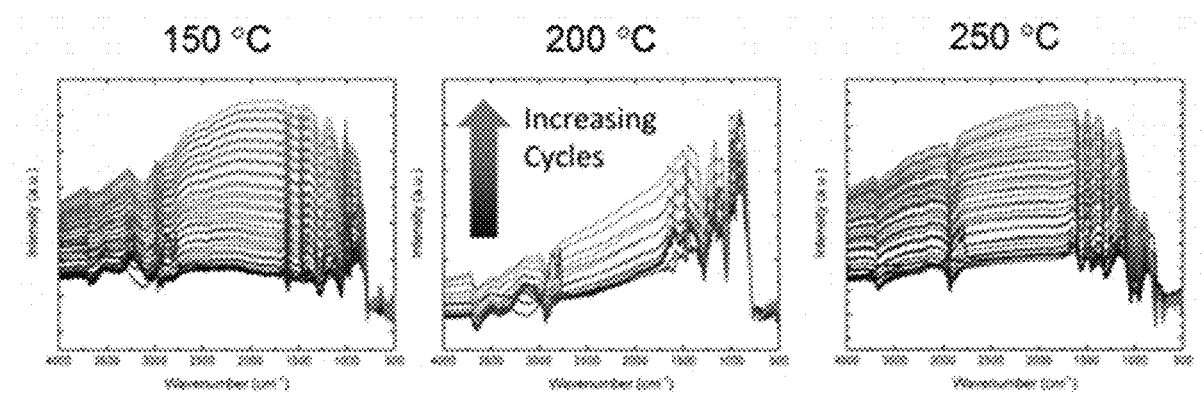
FIG. 19B shows each half cycle of $MoF_6$ and $H_2S$ on top of $HfO_2$, showing the background increase of the background absorption due to the increase in free carriers in the film.

FIG. 19A shows FTIR difference spectra of the $HfO_2$—$MoS_2$ interface following previous growth algorithms. Similar to the $Al_2O_3$—$MoS_2$ interface the OH consumption is observed during the first dose of $MoF_6$. Unlike the growth on $Al_2O_3$, at low temperatures interactions between the $HfO_2$ and $MoF_6$/$H_2S$ continue, indicated by the continued loss peaks in the 3750-2500 $cm^{-1}$ range. This indicates that $MoS_2$ growth on high dielectrics is not only temperature dependent but highly depends on the substrate. Regardless of the complex interactions, again a baseline absorption was observed as the number of $MoF_6$ and $H_2S$ cycles were repeated (FIG. 19B), indicating $MoS_2$ formation.

Figure 20A:
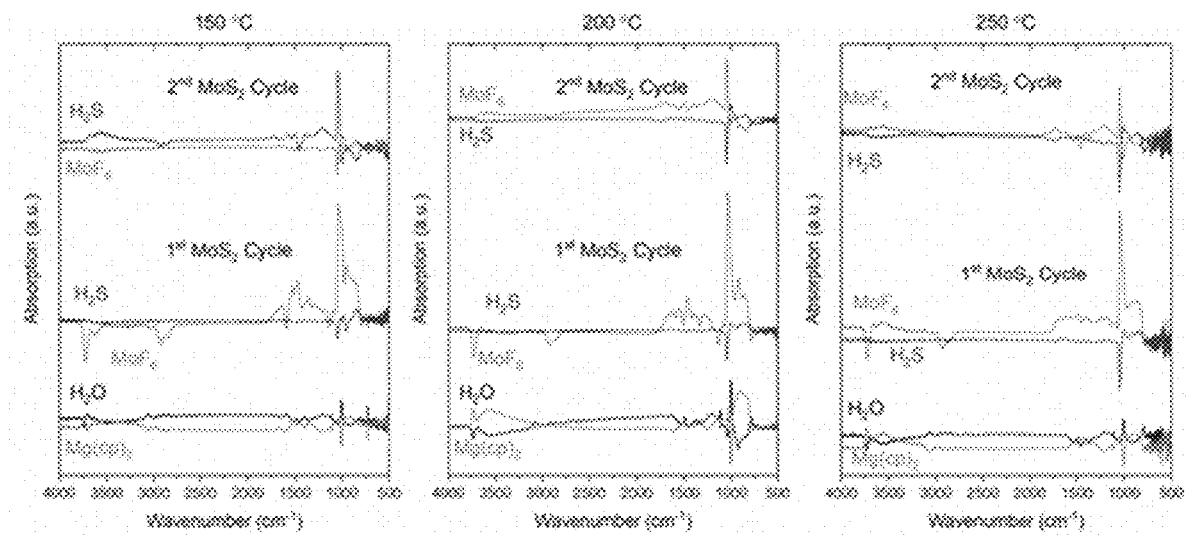
FIG. 20A shows FTIR difference scans of the last MgO cycle at the bottom and the first two cycles of $MoF_6$ and $H_2S$.
Figure 20B:
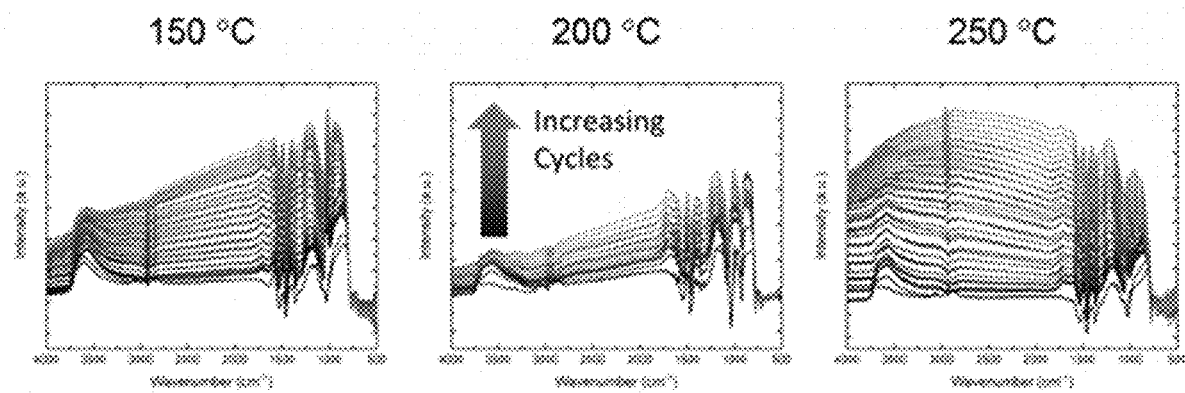
FIG. 20B shows each half cycle of $MoF_6$ and $H_2S$ on top of $HfO_2$, showing the background increase of the background absorption due to the increase in free carriers in the film.

Finally, FIG. 20A shows FTIR difference spectra of the MgO—$MoS_2$ interface following previous growth algorithms. Again the OH consumption is observed during the first dose of $MoF_6$, while little change is observed during the second cycle, like the AlO—$MoS_2$ interface. Unlike the other interfaces, an extremely large peak is observed at ~1000 $cm^{-1}$, which is most likely indicating of a metal oxyfluoride. The lack of the same large peak during the second cycle would suggest that this is only formed during the first cycle. Like the previous two experiments, the background absorption was observed in FIG. 20B.

Definitions

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A method of etching a transition metal dichalcogenide coating comprising:
    etching by a cycle of atomic layer etching comprising:
        performing an atomic layer etching exposure of a transition metal halide precursor to the transition metal dichalcogenide coating at a first etching temperature between 50° C. and 400° C.;
        performing an atomic layer etching exposure of water to the transition metal dichalcogenide coating at a second etching temperature between 50° C. and 400° C.; and
        removing portions of the transition metal dichalcogenide coating.

2. The method of claim 1, further comprising, prior to etching, depositing the transition metal dichalcogenide coating by:
    performing an a atomic layer deposition cycle exposure for a deposition transition metal halide precursor at a first deposition temperature between 50° C. and 400° C.; and
    performing a b atomic layer deposition cycle exposure for a sulfur precursor at a second deposition temperature between 50° C. and 400° C.,
    wherein the etching transition metal halide precursor and the deposition transition metal halide precursor comprise the same halide.

3. The method of claim 2, wherein the deposition metal transition is $MoF_6$.

4. The method of claim 3, wherein the sulfur precursor is $H_2S$.

5. The method of claim 4, wherein the transition metal dichalcogenide coating comprises $MoS_2$.

6. The method of claim 1, wherein the etching transition metal halide precursor comprises $MoF_6$.

7. The method of claim 6, wherein the atomic layer etching cycle exposure for the etching transition metal halide is for at least 15 seconds.

8. A method of etching a $MoS_2$ coating comprising:
    etching by a cycle of atomic layer etching comprising:
        performing an atomic layer etching exposure of a $MoF_6$ precursor to the $MoS_2$ coating at a first etching temperature between 50° C. and 400° C.;
        performing an atomic layer etching exposure of water to the transition metal dichalcogenide coating at a second etching temperature between 50° C. and 400° C.; and
        wherein the cycle of atomic layer etching removes portions of the $MoS_2$ coating, releasing volatile HF and $MoF_xO_y$ products.

* * * * *